(12) United States Patent
Yun

(10) Patent No.: US 12,238,963 B2
(45) Date of Patent: Feb. 25, 2025

(54) DISPLAY DEVICE AND METHOD OF MANUFACTURING THE SAME

(71) Applicant: Samsung Display Co., Ltd., Yongin-si (KR)

(72) Inventor: Haeju Yun, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 366 days.

(21) Appl. No.: 17/146,331

(22) Filed: Jan. 11, 2021

(65) Prior Publication Data

US 2021/0336224 A1  Oct. 28, 2021

(30) Foreign Application Priority Data

Apr. 27, 2020  (KR) .................. 10-2020-0051048

(51) Int. Cl.
*H10K 50/856*  (2023.01)
*H10K 50/844*  (2023.01)
(Continued)

(52) U.S. Cl.
CPC ......... *H10K 50/856* (2023.02); *H10K 50/844* (2023.02); *H10K 50/865* (2023.02);
(Continued)

(58) Field of Classification Search
CPC .. H10K 50/856; H10K 50/844; H10K 50/865; H10K 50/8445; H10K 50/8426;
(Continued)

(56) References Cited

U.S. PATENT DOCUMENTS 8,283,693 B2  10/2012  Lee et al.
8,319,238 B2  11/2012  Lee et al.
(Continued)

FOREIGN PATENT DOCUMENTS

JP   11-54273 A    2/1999
JP   11-329726 A   11/1999
(Continued)

*Primary Examiner* — Shaun M Campbell
*Assistant Examiner* — Teresa M. Arroyo
(74) *Attorney, Agent, or Firm* — Lewis Roca Rothgerber Christie LLP

(57) ABSTRACT

A display device having an optical panel with improved light extraction efficiency and light conversion efficiency is provided. The display device includes a first substrate, first to third light-emitting elements arranged on the first substrate, an encapsulation layer covering the first to third light-emitting elements, a first light blocking layer arranged on the encapsulation layer, the first light blocking layer including first openings respectively corresponding to the first to third light-emitting elements, a reflective layer arranged on the first light blocking layer, the reflective layer corresponding to an inner surface of each of the first openings, a first color conversion layer, a second color conversion layer, and a light transmission layer respectively located in first openings, a second light blocking layer on the first light blocking layer including second openings overlapping the first openings, and first to third color filter layers located in the second openings.

8 Claims, 15 Drawing Sheets

(51) Int. Cl.
*H10K 50/86* (2023.01)
*H10K 59/12* (2023.01)
*H10K 59/38* (2023.01)
*H10K 71/00* (2023.01)
*H10K 102/00* (2023.01)

(52) U.S. Cl.
CPC ............ *H10K 59/12* (2023.02); *H10K 59/38* (2023.02); *H10K 71/00* (2023.02); *H10K 59/1201* (2023.02); *H10K 2102/351* (2023.02)

(58) Field of Classification Search
CPC .... H10K 59/35; H10K 50/854; H10K 59/126; H10K 59/12; H10K 59/38; H10K 59/1201; H10K 71/00; H10K 2102/351; H10K 59/878; H10K 59/873; H10K 59/8792; H10K 59/131; H10K 59/1315
See application file for complete search history.

(56) References Cited

U.S. PATENT DOCUMENTS

| | | |
|---|---|---|
| 2007/0018186 A1 | 1/2007 | Shin et al. |
| 2010/0141116 A1* | 6/2010 | Nomura ................. H10K 59/38 313/498 |
| 2012/0087107 A1* | 4/2012 | Kunimasa ......... G02F 1/133617 362/84 |
| 2013/0331474 A1 | 12/2013 | Kida et al. |
| 2019/0025655 A1 | 1/2019 | Kim et al. |
| 2019/0235311 A1* | 8/2019 | Lee .................. G02F 1/133617 |
| 2019/0293990 A1* | 9/2019 | Kwon .................... H10K 59/38 |
| 2019/0310522 A1* | 10/2019 | Chu .................. G02F 1/133514 |
| 2020/0013766 A1* | 1/2020 | Kim ...................... H01L 25/167 |
| 2020/0013990 A1* | 1/2020 | Ueda .................. H10K 50/858 |
| 2020/0321400 A1* | 10/2020 | Park ..................... H10K 50/865 |
| 2021/0359078 A1* | 11/2021 | Kim .................... H10K 59/1315 |

FOREIGN PATENT DOCUMENTS

| | | | | |
|---|---|---|---|---|
| JP | 4295529 B2 | * | 7/2009 | |
| JP | 5263460 B1 | | 8/2013 | |
| KR | 10-0577738 B1 | | 5/2006 | |
| KR | 10-0757196 B1 | | 9/2007 | |
| KR | 10-0945989 B1 | | 3/2010 | |
| KR | 10-0958590 B1 | | 5/2010 | |
| KR | 10-1014339 B1 | | 2/2011 | |
| KR | 10-1809472 B1 | | 1/2018 | |
| KR | 10-2019-0009871 A | | 1/2019 | |
| KR | 20200130570 A | * | 11/2020 | ........ G02F 1/133617 |
| TW | 201222067 A | * | 6/2012 | ........... G02F 1/1333 |

* cited by examiner

DISPLAY DEVICE AND METHOD OF MANUFACTURING THE SAME

CROSS-REFERENCE TO RELATED APPLICATION

The present application claims priority to and the benefit of Korean Patent Application No. 10-2020-0051048, filed on Apr. 27, 2020, in the Korean Intellectual Property Office, the disclosure of which is incorporated herein in its entirety by reference.

BACKGROUND

1. Field

Aspects of one or more embodiments relate to a display device and a method of manufacturing the display device.

2. Description of Related Art

With the development of various electronic apparatuses such as mobile phones, personal digital assistants (PDAs), computers, and large televisions (TVs), various types of display apparatuses applicable thereto have been developed. For example, such display apparatuses include liquid crystal display apparatuses including a backlight unit and organic light-emitting display apparatuses emitting light of different colors from respective color areas. Also, display apparatuses including a quantum dot color conversion layer (QD-CCL) have recently been developed. A quantum dot excited by incident light emits light having a longer wavelength than the incident light, and light of a low wavelength band is mainly used as the incident light.

The above information disclosed in this Background section is only for enhancement of understanding of the background and therefore the information discussed in this Background section does not necessarily constitute prior art.

SUMMARY

One or more embodiments include a display device having an optical panel with relatively improved light extraction efficiency and light conversion efficiency and a method of manufacturing a display device, in which the manufacturing process of the display device is relatively simplified to improve manufacturing efficiency, reduce manufacturing quality defects, and reduce costs. However, these characteristics are merely example characteristics and the scope of embodiments according to the present disclosure are not limited thereby.

Additional aspects will be set forth in part in the description which follows and, in part, will be apparent from the description, or may be learned by practice of the presented example embodiments of the disclosure.

According to one or more example embodiments, a display device includes a first substrate, first to third light-emitting elements arranged on the first substrate, each of the first to third light-emitting elements including a first color emission layer, an encapsulation layer covering the first to third light-emitting elements, the encapsulation layer including at least one inorganic layer and at least one organic layer, a first light blocking layer arranged on the encapsulation layer, the first light blocking layer including first openings respectively corresponding to the first to third light-emitting elements, a reflective layer arranged on the first light blocking layer, the reflective layer corresponding to an inner surface of each of the first openings, a first color conversion layer located in a first opening corresponding to the first light-emitting element, a second color conversion layer located in a first opening corresponding to the second light-emitting element, a light transmission layer located in a first opening corresponding to the third light-emitting element, a second light blocking layer located on the first light blocking layer, the second light blocking layer including second openings overlapping the first openings, and first to third color filter layers located in the second openings, the first to third color filter layers respectively overlapping the first color conversion layer, the second color conversion layer, and the light transmission layer.

According to some example embodiments, the display device may further include a first capping layer covering the first color conversion layer, the second color conversion layer, and the light transmission layer.

According to some example embodiments, one surface of the first light blocking layer may be in contact with the first capping layer.

According to some example embodiments, the display device may further include a second capping layer covering the first to third color filter layers, wherein the first capping layer and the second capping layer may sandwich the first to third color filter layers therebetween.

According to some example embodiments, the display device may further include a second substrate arranged above one side of the first substrate such that the first to third light-emitting elements are located therebetween, wherein the second substrate may cover the first to third color filter layers and the second light blocking layer.

According to some example embodiments, the reflective layer may include a surface on which irregular irregularities are formed.

According to some example embodiments, the surface of the reflective layer may have a grain boundary or a cluster.

According to some example embodiments, the reflective layer may include a metal material that is silver, aluminum, gold, or a combination thereof.

According to some example embodiments, the reflective layer may have a thickness of 20 nm or more and 100 nm or less and an aspect ratio of 1 or more and 20 or less.

According to some example embodiments, each of the first color conversion layer, the second color conversion layer, and the light transmission layer may include scattering particles, wherein the first color conversion layer may further include a first quantum dot and the second color conversion layer may further include a second quantum dot, and the first quantum dot and the second quantum dot may include the same material, but may have different sizes.

According to one or more example embodiments, a display device includes a substrate, first to third light-emitting elements arranged on the substrate, each of the first to third light-emitting elements including a first color emission layer, a first color conversion layer arranged on the substrate and corresponding to the first light-emitting element, a second color conversion layer arranged on the substrate and corresponding to the second light-emitting element, a light transmission layer arranged on the substrate and corresponding to the third light-emitting element, a reflective layer surrounding each of the first color conversion layer, the second color conversion layer, and the light transmission layer on a plane, a first inorganic layer covering one side of each of the first color conversion layer, the second color conversion layer, and the light transmission layer, and a second inorganic layer covering the other side of each of the first color conversion layer, the second color conversion layer, and the light transmission layer and covering the reflective layer, wherein the first inorganic layer and the second inorganic layer are in contact with each other.

According to some example embodiments, one surface of the reflective layer facing the first color conversion layer, the second color conversion layer, and the light transmission layer may include irregular irregularities.

According to one or more example embodiments, a method of manufacturing a display device includes preparing a first substrate on which first to third light-emitting elements are arranged, each of the first to third light-emitting elements including a first color emission layer, forming, on the first substrate, an organic film pattern layer including first openings respectively corresponding to the first to third light-emitting elements, depositing a metal layer on the organic film pattern layer, forming a reflective layer by etching the metal layer through ion milling and attaching metal particles of the etched metal layer to inner surfaces of the first openings to thereby form the reflective layer, and forming, in the first openings, a first color conversion layer, a second color conversion layer, and a light transmission layer respectively overlapping the first to third light-emitting elements.

According to some example embodiments, the ion milling may be performed by accelerating ions of an inert gas and colliding the ions with the metal layer.

According to some example embodiments, a time required for performing the ion milling may be 400 seconds or more.

According to some example embodiments, the inert gas may be selected from nitrogen, helium, argon, and a mixed gas thereof.

According to some example embodiments, the method may further include forming a first capping layer covering the first color conversion layer, the second color conversion layer, and the light transmission layer.

According to some example embodiments, the method may further include forming, on the first capping layer, a second light blocking layer overlapping the organic film pattern layer, the second light blocking layer including second openings overlapping the first openings, and forming, in the second openings, first to third color filter layers respectively corresponding to the first color conversion layer, the second color conversion layer, and the light transmission layer.

According to some example embodiments, the method may further include preparing a second substrate on which first to third color filter layers respectively corresponding to the first to third light-emitting elements are formed, wherein the organic film pattern layer may be formed on the second substrate.

According to some example embodiments, the method may further include removing the organic film pattern layer after forming the reflective layer.

These and/or other aspects will become more apparent and more readily appreciated from the following description of the example embodiments, the accompanying drawings, and claims.

These general and specific aspects may be implemented by using a system, a method, a computer program, or a combination of a certain system, method, and computer program.

BRIEF DESCRIPTION OF THE DRAWINGS

The above and other aspects, features, and characteristics of certain example embodiments of the disclosure will be more apparent from the following description taken in conjunction with the accompanying drawings, in which.

DETAILED DESCRIPTION

Figure 1:
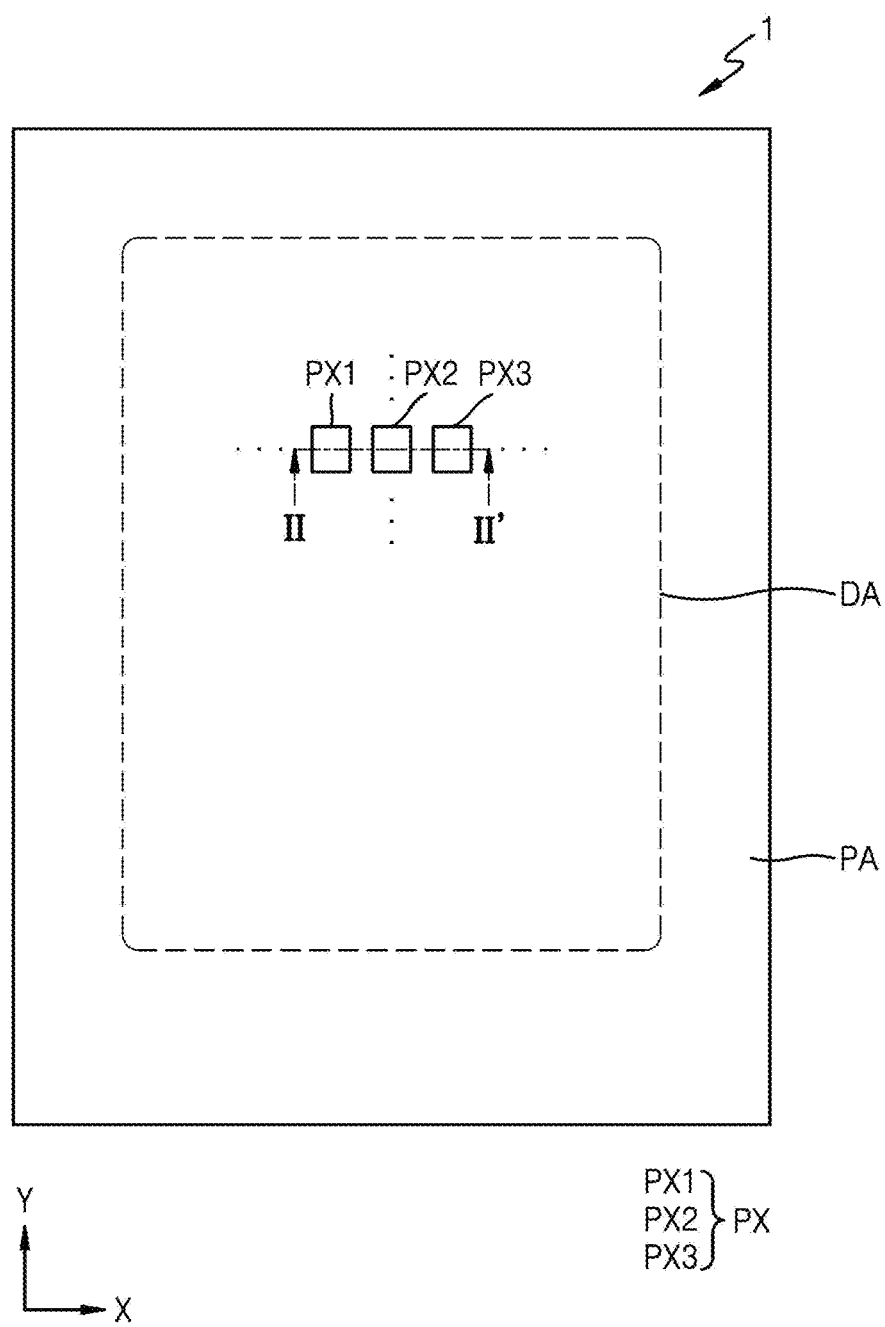
FIG. 1 is a schematic plan view illustrating a display device according to some example embodiments.

Reference will now be made in more detail to aspects of some example embodiments, which are illustrated in the accompanying drawings, wherein like reference numerals refer to like elements throughout. In this regard, the present example embodiments may have different forms and should not be construed as being limited to the descriptions set forth herein. Accordingly, the example embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

As the present disclosure allows for various changes and numerous embodiments, example embodiments will be illustrated in the drawings and described in more detail in the written description. The attached drawings for illustrating one or more embodiments are referred to in order to gain a sufficient understanding, the merits thereof, and the characteristics accomplished by the implementation. However, the embodiments may have different forms and should not be construed as being limited to the descriptions set forth herein.

The example embodiments will be described below in more detail with reference to the accompanying drawings. Those components that are the same or are in correspondence are rendered the same reference numeral regardless of the figure number, and redundant explanations are omitted.

While such terms as "first," "second," etc., may be used to describe various components, such components are not to be limited to the above terms. The above terms are used only to distinguish one component from another.

An expression used in the singular encompasses the expression of the plural, unless it has a clearly different meaning in the context.

In the present specification, it is to be understood that the terms "including," "having," and "comprising" are intended to indicate the existence of the features, numbers, steps, actions, components, parts, or combinations thereof disclosed in the specification, and are not intended to preclude the possibility that one or more other features, numbers, steps, actions, components, parts, or combinations thereof may exist or may be added.

It will be understood that when a layer, region, or component is referred to as being "formed on," another layer, region, or component, it may be directly or indirectly formed on the other layer, region, or component. That is, for example, intervening layers, regions, or components may be present.

Sizes of components in the drawings may be exaggerated for convenience of explanation. In other words, because sizes and thicknesses of components in the drawings are arbitrarily illustrated for convenience of explanation, the following embodiments are not limited thereto.

When a certain embodiment may be implemented differently, a specific process order may be performed differently from the described order. For example, two consecutively described processes may be performed substantially at the same time or performed in an order opposite to the described order.

In the specification, the phrase "A and/or B" denotes A, B, or A and B. In addition, the phrase "at least one of A and B" denotes A, B, or A and B.

In the embodiments below, when layers, areas, or elements or the like are referred to as being "connected," it will be understood that they may be directly connected or an intervening portion may be present between layers, areas or elements. For example, when layers, areas, or elements or the like are referred to as being "electrically connected," they may be directly electrically connected, or layers, areas or elements may be indirectly electrically connected and an intervening portion may be present.

The x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

FIG. 1 is a schematic plan view illustrating a display device 1 according to some example embodiments.

Referring to FIG. 1, the display device 1 may include a display area DA and a peripheral area PA located outside (e.g., outside a periphery or footprint of) the display area DA. The display device 1 may provide an image through an array of a plurality of pixels, e.g., first to third pixels PX1, PX2, and PX3, arranged two-dimensionally (e.g., in a matrix arrangement) in the display area DA. The peripheral area PA is an area that does not provide or display images, and may entirely or partially surround the display area DA. A driver or the like for providing an electrical signal or power to the first to third pixels PX1, PX2, and PX3 may be arranged in the peripheral area PA. In the peripheral area PA, a pad, which is an area to which an electronic device or a printed circuit board may be electrically connected, may be arranged.

Hereinafter, although the display device 1 is described as including an organic light-emitting diode (OLED) as a light-emitting element, the display device 1 is not limited thereto. According to some example embodiments, the display device 1 may be an inorganic light-emitting display device (or an inorganic electroluminescence (EL) display device) such as a micro light-emitting display (LED), or a display device such as a quantum dot light-emitting display device. For example, an emission layer of the light-emitting element provided in the display device 1 may include an organic material, include an inorganic material, include quantum dots, include an organic material and quantum dots, or include an inorganic material and quantum dots.

Figure 2:
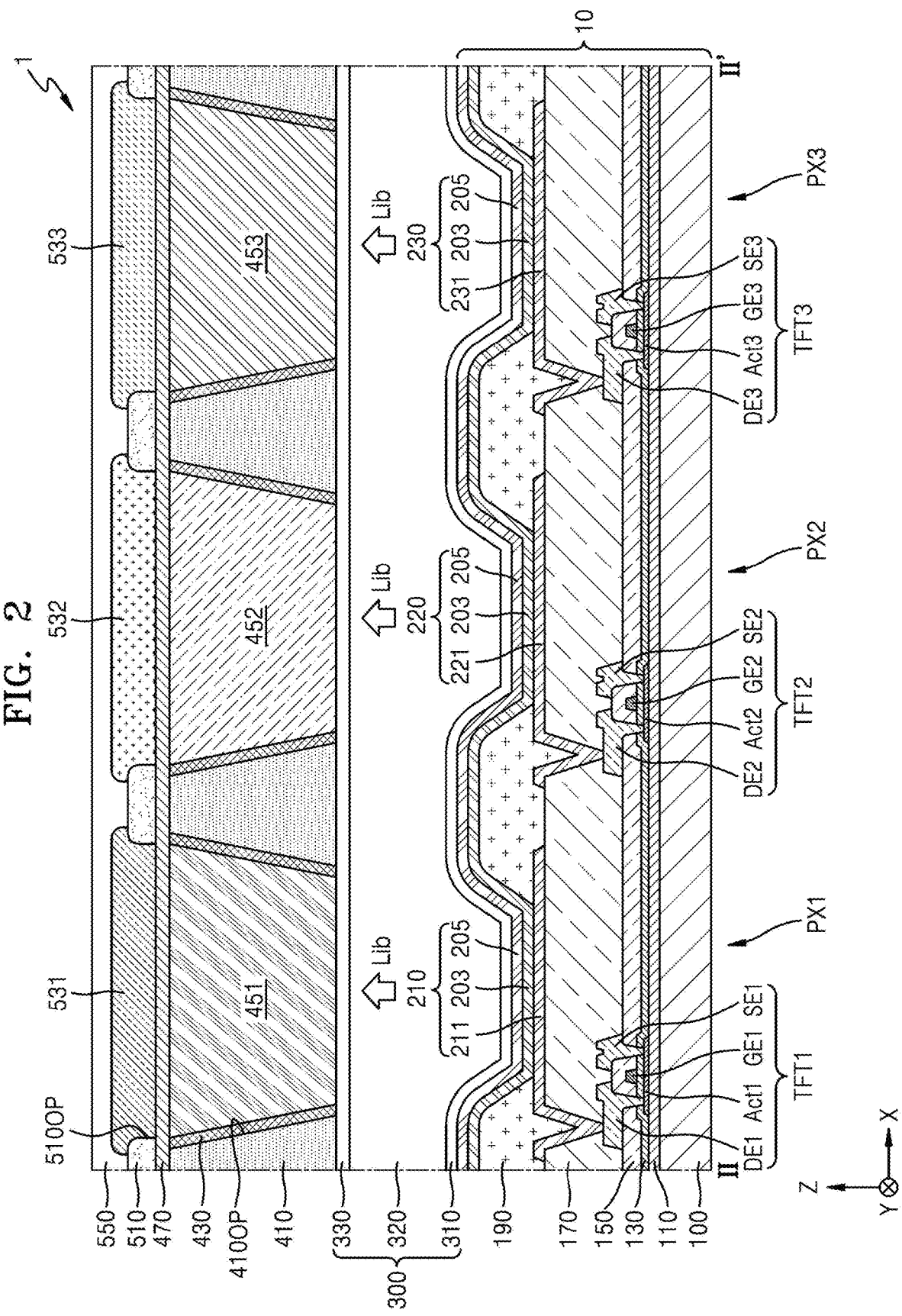
FIG. 2 is a schematic cross-sectional view of the display device, taken along the line II-II' of FIG. 1.

FIG. 2 is a schematic cross-sectional view of the display device 1, taken along the line II-II' of FIG. 1.

Referring to FIG. 2, the display device 1 according to some example embodiments may include the first to third pixels PX1 to PX3. This case is merely an example, and the display device 1 may include more pixels PX. In addition, although FIG. 2 illustrates that the first to third pixels PX1 to PX3 are adjacent to each other, embodiments according to the present disclosure are not limited thereto. That is, other components such as wiring lines may be between the first to third pixels PX1 to PX3. Accordingly, for example, the first pixel PX1 and the second pixel PX2 may not be pixels located adjacent to each other. In addition, in FIG. 2, cross-sections of the first to third pixels PX1 to PX3 may not be cross-sections in the same direction.

The display device 1 according to some example embodiments may include a first substrate 100. The first substrate 100 may include glass, metal, or polymer resin. When the first substrate 100 is flexible or bendable, the first substrate 100 may include a polymer resin, such as polyethersulfone, polyacrylate, polyetherimide, polyethylene naphthalate, polyethylene terephthalate, polyphenylene sulfide, polyarylate, polyimide, polycarbonate, or cellulose acetate propionate. Various modifications are possible. For example, the first substrate 100 may have a multi-layer structure including two layers each including such a polymer resin and a barrier layer including an inorganic material (e.g., silicon oxide, silicon nitride, or silicon oxynitride) between the two layers.

A first pixel electrode 211, a second pixel electrode 221, and a third pixel electrode 231 may be located on the first substrate 100. That is, a plurality of light-emitting elements may be located on the first substrate 100, and FIG. 2 illustrates that a first light-emitting element 210, a second light-emitting element 220, and a third light-emitting element 230 are located on the first substrate 100. In addition to the light-emitting elements, first to third thin-film transistors TFT1, TFT2, and TFT3 that are electrically connected to the light-emitting elements may also be located on the first substrate 100, FIG. 2 illustrates that OLEDs as light-emitting elements are located on the first substrate 100. The description that the OLEDs are electrically connected to the first to third thin-film transistors TFT1, TFT2, and TFT3 may be understood as that the first to third pixel electrodes 211, 221, and 231 are electrically connected to the first to third TFTs TFT1, TFT2, and TFT3.

For reference, in FIG. 2, the first thin-film transistor TFT1 is located in the first pixel PX1, the second thin-film transistor TFT2 is located in the second pixel PX2, and the third thin-film transistor TFT3 is located in the third pixel PX3. In addition, as illustrated in FIG. 2, each of the first to third thin-film transistors TFT1 to TFT3 may be electrically connected to a pixel electrode of a light-emitting element located in a corresponding pixel. Hereinafter, for convenience, the first thin-film transistor TFT1 and the first light-emitting element 210 connected thereto will be described, and the same description may apply to the second and third thin-film transistors TFT2 and TFT3 and the second and third light-emitting elements connected thereto. That is, the description of a second semiconductor layer Act2, a second gate electrode GE2, a second source electrode SE2, and a second drain electrode DE2 of the second thin-film transistor TFT2, and the description of the second pixel electrode 221 will be omitted. Similarly, the description of a third semiconductor layer Act3, a third gate electrode GE3, a third source electrode SE3, and a third drain electrode DE3 of the third thin-film transistor TFT3, and the description of the third pixel electrode 231 will be omitted.

The first thin-film transistor TFT1 may include a first semiconductor layer Act1, a first gate electrode GE1, a first source electrode SE1, and a first drain electrode DE1. The first semiconductor layer Act1 may include amorphous silicon, polycrystalline silicon, an organic semiconductor material, or an oxide semiconductor material. The first gate electrode GE1 may include various conductive materials and have various layer structures. For example, the first gate electrode GE1 may include a molybdenum (Mo) layer or an aluminum (Al) layer. Alternatively, the first gate electrode GE1 may include a titanium nitride ($TiN_x$) layer, an Al layer, and/or a titanium (Ti) layer. The first source electrode SE1 and the first drain electrode DE1 may also include various conductive materials and have various layer structures. For example, the first source electrode SE1 and the first drain electrode DE1 may each include a Ti layer, an Al layer, and/or a copper (Cu) layer.

In order to ensure that there is sufficient insulation between the first semiconductor layer Act1 and the first gate electrode GE1, a gate insulating layer 130 including an inorganic material such as silicon oxide, silicon nitride, and/or silicon oxynitride may be between the semiconductor layer Act1 and the first gate electrode GE1. In addition, an interlayer insulating layer 150 including an inorganic material such as silicon oxide, silicon nitride, and/or silicon oxynitride may be arranged on the first gate electrode GE1, and the first source electrode SE1 and the first drain electrode DE1 may be arranged on the interlayer insulating layer 150. The interlayer insulating layer 150 including the inorganic material may be formed through chemical vapor deposition (CVD) or atomic layer deposition (ALD). This description also applies to embodiments to be described later and modifications thereof.

A buffer layer 110 including an inorganic material such as silicon oxide, silicon nitride and/or silicon oxynitride may be between the first thin-film transistor TFT1 and the first substrate 100. The buffer layer 110 may serve to increase the smoothness of the upper surface of the first substrate 100 or to prevent or reduce impurities from the first substrate 100 or the like from penetrating into the first semiconductor layer Act1 of the first thin-film transistor TFT1.

In addition, a planarization layer 170 may be arranged on the first thin-film transistor TFT1. For example, as shown in FIG. 2, when an OLED is arranged on the first thin-film transistor TFT1, the planarization layer 170 may substantially planarize an upper film portion of a protective layer covering the first thin-film transistor TFT1. The planarization layer 170 may include an organic material such as acrylic, benzocyclobutene (BCB), or hexamethyldisiloxane (HMDSO). In FIG. 2, the planarization layer 170 is shown as a single layer, but may include multiple layers. That is, various modifications may be possible.

The first light-emitting element 210 may be located on the planarization layer 170 of the first substrate 100. A stacked structure including the first pixel electrode 211, an intermediate layer 203, and an opposite electrode 205 may form the first light-emitting element 210. As the first light-emitting element 210, an OLED as shown in FIG. 2 may be used. The OLED may emit light of a first color, and an emission region of the OLED corresponds to a pixel PX.

For example, in the case of the first pixel PX1, the OLED may have, for example, the first pixel electrode 211, the opposite electrode 205, and the intermediate layer 203 located therebetween and including an emission layer. The first pixel electrode 211 is in contact with one of the first source electrode SE1 and the first drain electrode DE1 through an opening formed in the planarization layer 170, as shown in FIG. 2, and is thus electrically connected to the first thin-film transistor TFT1. The second pixel PX2 may also have a second pixel electrode 221, and the third pixel PX3 may also have a third pixel electrode 231. Each of the first to third pixel electrodes 211 to 231 includes a light-transmitting conductive layer including a light-transmitting conductive oxide such as ITO, $In_2O_3$, or IZO, and a reflective layer including a metal such as Al or Ag. For example, each of the first to third pixel electrodes 211 to 231 may have a three-layer structure of ITO/Ag/ITO.

The intermediate layer 203 including an emission layer may be integrally formed over the first to third pixel electrodes 211 to 231, and the opposite electrode 205 on the intermediate layer 203 may also be integrally formed over the first to third pixel electrodes 211 to 231. The opposite electrode 205 may include a light-transmitting conductive layer including ITO, $In_2O_3$, or IZO, and may also include a semi-transmissive layer including a metal such as Al or Ag. For example, the opposite electrode 205 may include a semi-transmissive layer including Mg and Ag.

A pixel-defining layer 190 may be arranged on the planarization layer 170. The pixel-defining layer 190 has an opening corresponding to each pixel, that is, an opening through which at least a central portion of each of the first to third pixel electrodes 211 to 231 is exposed, thereby defining a pixel. In addition, in the case shown in FIG. 2, the pixel-defining layer 190 increases a distance between an edge of each of the first to third pixel electrodes 211 to 231 and the opposite electrode 205 to prevent arcs or the like from occurring at the edge of each of the first to third pixel electrodes 211 to 231. The pixel-defining layer 190 may include an organic material such as polyimide or HMDSO.

The intermediate layer 203 may include a low molecular weight material or a high molecular weight material (or polymer material). When the intermediate layer 203 includes a low molecular weight material, the intermediate layer 203 may have a structure in which a hole injection layer (HIL), a hole transport layer (HTL), an emission layer (EML), an electron transport layer (ETL), an electron injection layer (EIL), and the like are stacked in a single or composite structure, and may be formed by an evaporation method.

When the intermediate layer 203 includes a high molecular weight material, the intermediate layer 203 may have a structure including an HTL and an EML. In this case, the HTL may include PEDOT, and the EML may include a high molecular weight material such as poly-phenylenevinylene (PPV)-based material or polyfluorene-based material. The intermediate layer 203 may be formed by screen printing, inkjet printing, vapor deposition, or laser induced thermal imaging (LITI). The intermediate layer 203 is not necessarily limited thereto and embodiments according to the present disclosure may have various structures.

The intermediate layer 203 may include a layer integrally formed over the first to third pixel electrodes 211 to 231, as described above. However, according to some example embodiments, the intermediate layer 203 may include a layer patterned to correspond to each of the first to third pixel electrodes 211 to 231. In any case, the intermediate layer 203 includes a first color emission layer. The first color emission layer may be integrated over the first to third pixel electrodes 211 to 231. If necessary, the first color emission layer may be patterned to correspond to each of the first to third pixel electrodes 211 to 231. The first color emission layer may emit, for example, light having a wavelength belonging to about 450 nm to about 495 nm.

The opposite electrode 205 may be located on the intermediate layer 203 to correspond to the first to third pixel electrodes 211 to 231. The opposite electrode 205 may be integrally formed in a plurality of OLEDs.

Because the OLEDs may be easily damaged by moisture or oxygen from the outside, an encapsulation layer 300 may cover the OLEDs to protect them.

The encapsulation layer 300 may be arranged on the opposite electrode 205. The OLEDs may be covered by the encapsulation layer 300. The encapsulation layer 300 may include first and second inorganic encapsulation layers 310 and 330 and an organic encapsulation layer 320 therebetween.

The first and second inorganic encapsulation layers 310 and 330 may each include one or more inorganic insulating materials. The inorganic insulating material may include aluminum oxide, titanium oxide, tantalum oxide, hafnium oxide, zinc oxide, silicon oxide, silicon nitride, and/or silicon oxynitride. The first and second inorganic encapsulation layers 310 and 330 may be formed through chemical vapor deposition.

The organic encapsulation layer 320 may include a polymer-based material. Examples of the polymer-based material may include acrylic resin, epoxy resin, polyimide and polyethylene. For example, the organic encapsulation layer 320 may include an acrylic resin, such as polymethyl methacrylate or polyacrylic acid. The organic encapsulation layer 320 may be formed by curing a monomer or applying a polymer.

A stacked structure from the first substrate 100 described above to the first to third light-emitting elements 210, 220, and 230 may be referred to as a display layer 10. The display layer 10 may generate incident light Lib incident on a first color conversion layer 451, a second color conversion layer 452, and a light transmission layer 453, which will be described in more detail later, and the incident light Lib emitted from the display layer 10 may travel to the first color conversion layer 451, the second color conversion layer 452, and the light transmission layer 453 through the encapsulation layer 300.

The display device 1 according to some example embodiments may include a first light blocking layer 410, a reflective layer 430, the first color conversion layer 451, the second color conversion layer 452, the light transmission layer 453, a first capping layer 470, a second light blocking layer 510, first to third color filter layers 531, 532, and 533, and a second capping layer 550, which are arranged on the encapsulation layer 300.

The first light blocking layer 410 may include first openings 410OP corresponding to the first to third light-emitting elements 210, 220, and 230, respectively.

The first light blocking layer 410 may have various colors including black or white. For example, the first light blocking layer 410 may be black and may include a black matrix. The first light blocking layer 410 may include a light blocking material, and the light blocking material may include an opaque inorganic insulating material such as chromium oxide or molybdenum oxide, or an opaque organic insulating material such as black resin. As another example, the first light blocking layer 410 may include an organic insulating material such as white resin.

As described below, the first light blocking layer 410 may prevent color mixing between beams of light converted or transmitted in the first color conversion layer 451, the second color conversion layer 452, and the light transmission layer 453 adjacent to each other.

The first color conversion layer 451, the second color conversion layer 452, and the light transmission layer 453 may be arranged in the first openings 410OP of the first light blocking layer 410, respectively, and may correspond to the first light-emitting element 210, the second light-emitting element 220, and the third light-emitting element 230, respectively. The first color conversion layer 451, the second color conversion layer 452, and the light transmission layer 453 may be spaced apart from each other at regular intervals, and the first light blocking layer 410 may be between them.

The first color conversion layer 451, the second color conversion layer 452, and the light transmission layer 453 may convert the incident light Lib generated in the display layer 10 into light having a certain color or transmit the incident light Lib, and may emit color-converted or transmitted light toward the first to third color filter layers 531, 532, and 533. Light that is color-converted or transmitted by the first color conversion layer 451, the second color conversion layer 452, and the light transmission layer 453 may be one of red light, green light, and blue light.

For example, the incident light Lib may be blue light having a wavelength of 400 nm or more and less than 495 nm, and light emitted through the first to third color filter layers 531, 532, and 533 may include red light having a wavelength of 580 nm or more and less than 750 nm, green light having a wavelength of 495 nm or more and less than 580 nm, and blue light having a wavelength of 400 nm or more and less than 495 nm.

The incident light Lib may be converted into red light through the first color conversion layer 451, the red light may be emitted toward the first color filter layer 531, and light passing through the first color filter layer 531 may be emitted to the outside. The incident light Lib may be converted into green light through the second color conversion layer 452, the green light may be emitted toward the second color filter layer 532, and light passing through the second color filter layer 532 may be emitted to the outside. The incident light Lib may be transmitted through the light transmission layer 453 without color conversion and transmitted light may be emitted toward the third color filter layer 533, and light passing through the third color filter layer 533 may be emitted to the outside.

Accordingly, when the incident light Lib emitted from the display layer 10 passes through the first color conversion layer 451, the second color conversion layer 452, and the light transmission layer 453, the incident light Lib is converted into green light, red light, or blue light or is transmitted without color conversion, and thus, a color image is displayed.

The reflective layer 430 may be arranged on the inner surface of each of the first openings 410OP of the first light blocking layer 410. The reflective layer 430 may be located in a non-emission region and may be arranged so as not to overlap an emission region. The reflective layer 430 may include holes overlapping the first openings 410OP. The incident light Lib may travel through the holes of the reflective layer 430.

According to some example embodiments, the reflective layer 430 may correspond to the inner surface of each of the first openings 410OP of the first light blocking layer 410. The reflective layer 430 may be arranged only on the inner surface of each of the first openings 410OP, and thus, the reflective layer 430 may be between the first light blocking layer 410 and the first color conversion layer 451, between the first light blocking layer 410 and the second color conversion layer 452, and between the first light blocking layer 410 and the light transmission layer 453. The reflective layer 430 may expose a portion of the encapsulation layer 300 overlapping the first opening 410OP and one surface of the first light blocking layer 410 facing the opposite side of the first substrate 100. Accordingly, the first color conversion layer 451, the second color conversion layer 452, and the light transmission layer 453 may each contact the second inorganic encapsulation layer 330 of the encapsulation layer 300, and the first light blocking layer 410 may contact the first capping layer 470 to be described later.

The reflective layer 430 may include a surface on which irregularities are formed. The reflective layer 430 may include a metal material having excellent reflectance, such as silver (Ag), aluminum (Al), gold (Au), or a combination thereof. Light reaching the reflective layer 430 may be reflected from the surface of the reflective layer 430. As a comparative example, in the case where the reflective layer 430 is omitted, when some of the incident light Lib travels toward the inner surfaces of the first openings 410OP of the first light blocking layer 410, the some of the incident light Lib may be absorbed and disappear and thus optical loss may occur. However, according to some example embodiments, the reflective layer 430 is provided on the inner surfaces of the first openings 410OP, and even if some of the incident light Lib travels toward the inner surfaces of the first openings 410OP, the some of the incident light Lib is reflected back by the reflective layer 430, and thus, light loss may be reduced and light extraction efficiency and brightness of the display device 1 may be improved.

In addition, light whose color is not converted by the first and second color conversion layers 451 and 452 to be described later and which travels toward the inner surfaces of the first openings 410OP is reflected back from the reflective layer 430, and thus, the light may be excited by quantum dots in the second color conversion layers 451 and 452 and color of the light may be converted. Through this operation, light conversion efficiency may be improved.

The first capping layer 470 may be arranged on the first color conversion layer 451, the second color conversion layer 452, and the light transmission layer 453. The first capping layer 470 may be formed to cover the first color conversion layer 451, the second color conversion layer 452, and the light transmission layer 453. The first capping layer 470 may include an inorganic insulating material such as silicon nitride, silicon oxide, or silicon oxynitride.

The first capping layer 470 and the encapsulation layer 300 may sandwich the first color conversion layer 451, the second color conversion layer 452, and the light transmission layer 453 therebetween. The first and second color conversion layers 451 and 452 may each include quantum dots, as described below with reference to FIG. 3. Because the quantum dots are composed of nanoparticles, the quantum dots may deteriorate by reacting with moisture, oxygen, and the like. Accordingly, the first capping layer 470 and the encapsulation layer 300 may cover the first and second color conversion layers 451 and 452 above and below the first and second color conversion layers 451 and 452 so that moisture, oxygen, and the like do not flow into the quantum dots in the first and second color conversion layers 451 and 452.

A second light blocking layer 510 may be arranged on the first capping layer 470. The second light blocking layer 510 may include second openings 510OP overlapping the first openings 410OP, respectively. The second light blocking layer 510 may include a light blocking material. The light blocking material may include an opaque inorganic insulating material such as chromium oxide or molybdenum oxide, or an opaque organic insulating material such as black resin, and may block light from being emitted outside an emission region to thereby prevent light leakage from occurring in the display device 1.

The first to third color filter layers 531, 532, and 533 may be located in the second openings 510OP of the second light blocking layer 510, respectively. For example, the first color filter layer 531 may be located in a second opening 510OP corresponding to the first light-emitting element 210, the second color filter layer 532 may be located in a second opening 510OP corresponding to the second light-emitting element 220, and the third color filter layer 533 may be located in a second opening 510OP corresponding to the third light-emitting element 230. According to some example embodiments, some of the first to third color filter layers 531, 532, and 533 may be arranged on the second light blocking layer 510.

The first to third color filter layers 531, 532, and 533 may be organic patterns including dyes or pigments. The first to third color filter layers 531, 532, and 533 may include pigments or dyes of different colors, respectively, and selectively transmit only light of a corresponding color. For example, the first color filter layer 531 may selectively transmit only red light by including a red pigment or dye, and the second color filter layer 532 may selectively transmit only green light by including a green pigment or dye. The third color filter layer 533 may selectively transmit only blue light by including a blue pigment or dye.

When considering the amount of light with each color emitted from the display device 1, the thickness of the third color filter layer 533 may be greater than the thicknesses of the first color filter layer 531 and the second color filter layer 532.

As a further example, the second light blocking layer 510 may include the same material as the third color filter layer 533 and may be formed by the same process as the third color filter layer 533. In this case, the first color filter layer 531 may be located in a second opening 510OP of the second light blocking layer 510 corresponding to the first light-emitting element 210, and the second color filter layer 532 may be located in a second opening 510OP of the second light blocking layer 510 corresponding to the second light-emitting element 220. A second opening 510OP may not be formed at a position corresponding to the third light-emitting element 230, and a portion of the second light blocking layer 510 may function as the third color filter layer 533. A portion of the second light blocking layer 510 arranged between the first color filter layer 531 and the second color filter layer 532 may prevent color mixing between beams of light converted in the first color conversion layer 451 and the second color conversion layer 452 adjacent to each other.

The second capping layer 550 may be arranged on the second light blocking layer 510. The second capping layer 550 may be formed to cover the first to third color filter layers 531, 532, and 533. The second capping layer 550 may include an inorganic insulating material such as silicon nitride, silicon oxide, or silicon oxynitride.

Light emitted from the display layer 10 may not transmit through the light blocking materials of the first light blocking layer 410 and the second light blocking layer 510, and may transmit only through a region where the first opening 410OP of the first light blocking layer 410 overlaps the second opening 510OP of the second light blocking layer 510. Therefore, the region where the first opening 410OP and the second opening 510OP overlap each other may be defined as an emission region, and a region where the light blocking materials of the first light blocking layer 410 and the second light blocking layer 510 are located may be defined as a non-emission region.

Figure 3:
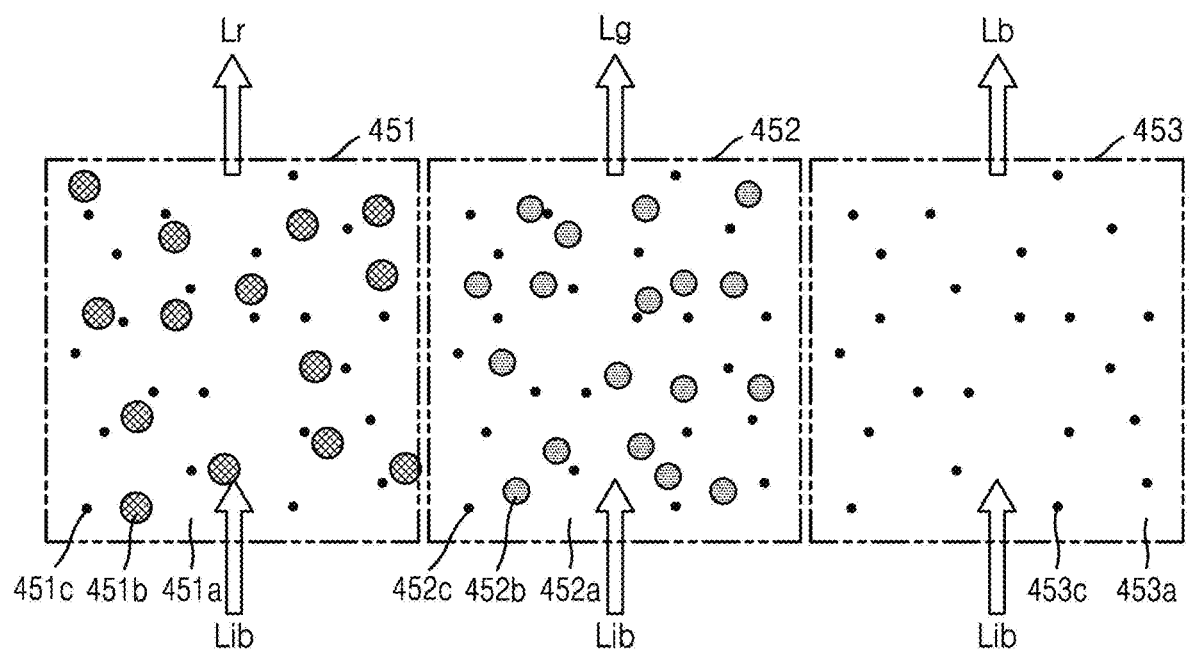
FIG. 3 is a schematic cross-sectional view illustrating a portion of a display device according to some example embodiments.

FIG. 3 is a schematic cross-sectional view illustrating a portion of a display device according to some example embodiments.

Referring to FIG. 3, a first color conversion layer 451, a second color conversion layer 452, and a light transmission layer 453 may be provided in the display device 1 according to some example embodiments.

For example, the first color conversion layer 451 may convert blue incident light Lib into red light Lr. To this end, the first color conversion layer 451 may include a first photosensitive polymer 451a in which first quantum dots 451b are dispersed.

The first photosensitive polymer 451a may be an organic material having light transmission properties, such as silicone resin and epoxy resin.

The first quantum dots 451b are excited by the blue incident light Lib to isotropically emit the red light Lr having a wavelength longer than that of blue light. The first quantum dots 451b may include a Group II-VI compound, a Group III-V compound, a Group IV-VI compound, a Group IV compound, or a combination thereof.

First scattering particles 451c may be further dispersed in the first photosensitive polymer 451a. The first scattering particles 451c may scatter blue incident light Lib, which is not absorbed by the first quantum dots 451b, to excite more first quantum dots 451b, and thus, the color conversion efficiency of the first color conversion layer 451 may be increased. The first scattering particles 451c may include, for example, titanium oxide $TiO_2$ or metal particles.

For example, the second color conversion layer 452 may convert the blue incident light Lib into green light Lg. The second color conversion layer 452 may include a second photosensitive polymer 452a having second quantum dots 452b dispersed therein, and second scattering particles 452c may be dispersed in the second photosensitive polymer 452a together with the second quantum dots 452b, thereby increasing the color conversion rate of the second color conversion layer 452.

The second photosensitive polymer 452a may include the same material as the first photosensitive polymer 451a, and the second scattering particles 452c may include the same material as the first scattering particles 451c. The second quantum dots 452b may include a Group II-VI compound, a Group III-V compound, a Group IV-VI compound, a Group IV compound, or a combination thereof. That is, the second quantum dots 452b may be the same material as the first quantum dots 451b. However, the size of the second quantum dots 452b may be less than the size of the first quantum dots 451b, and thus, the second quantum dots 452b may be excited by the blue incident light Lib and have a wavelength greater than the wavelength of blue light, and may isotropically emit green light Lg having a wavelength that is less than that of the red light Lr.

The light transmission layer 453 may include a third photosensitive polymer 453a in which third scattering particles 453c are dispersed. That is, the light transmission layer 453 does not include a separate quantum dot that may be excited by the blue incident light Lib. The third photosensitive polymer 453a may include an organic material having light transmission properties, like the first photosensitive polymer 451a, and the third scattering particles 453c may include the same material as the first scattering particles 451c. Therefore, the blue incident light Lib incident on the light transmission layer 453 may transmit through the light transmission layer 453 without a color change, and thus, light emitted through the light transmission layer 453 may be blue light Lb. However, the blue incident light Lib may be scattered, by the third scattering particles 453c, inside the light transmission layer 453 and emitted to the outside. The light transmission layer 453 may transmit the blue incident light Lib without changing the color thereof, thereby obtaining higher light efficiency.

FIGS. 4A to 4G are schematic cross-sectional views illustrating processes of a method of manufacturing a display device, according to some example embodiments. FIGS. 4A to 4G may be cross-sectional views illustrating processes of a method of manufacturing the display device of FIG. 2.

Figure 4A:
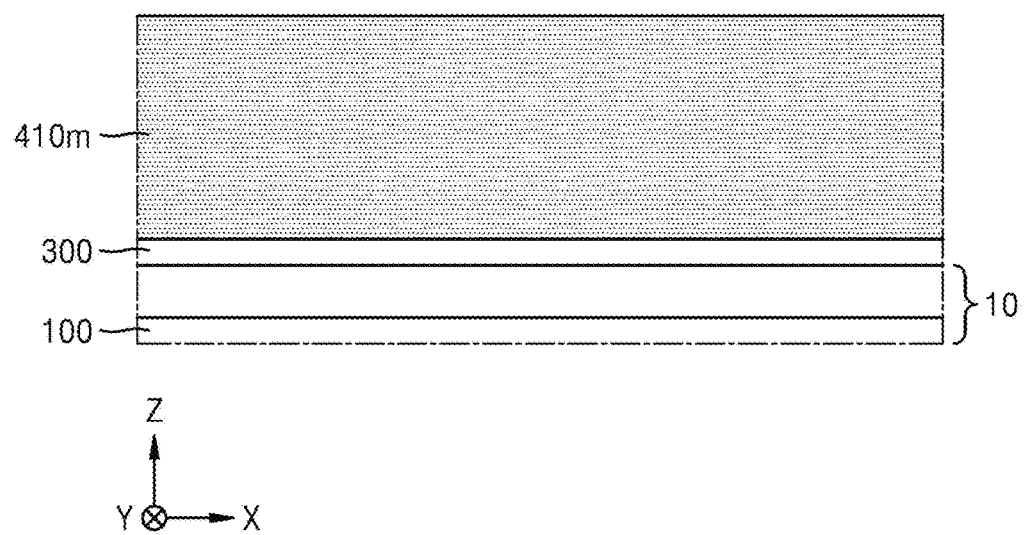
FIGS. 4A to 4G are schematic cross-sectional views illustrating processes of a method of manufacturing a display device, according to some example embodiments.

Referring to FIG. 4A, first, a display layer 10 including a first substrate 100 on which the first to third light-emitting elements 210, 220, and 230 are arranged may be prepared. An encapsulation layer 300 may be already formed on the display layer 10.

In order to form, on the first substrate 100, a first light blocking layer 410 including first openings 410OP respectively corresponding to the first to third light-emitting elements 210, 220, and 230, an organic film 410m may be applied on the entire surface of the encapsulation layer 300. For the process of applying the organic film 410m, inkjet printing, spin coating, or spray coating may be used.

Figure 4B:
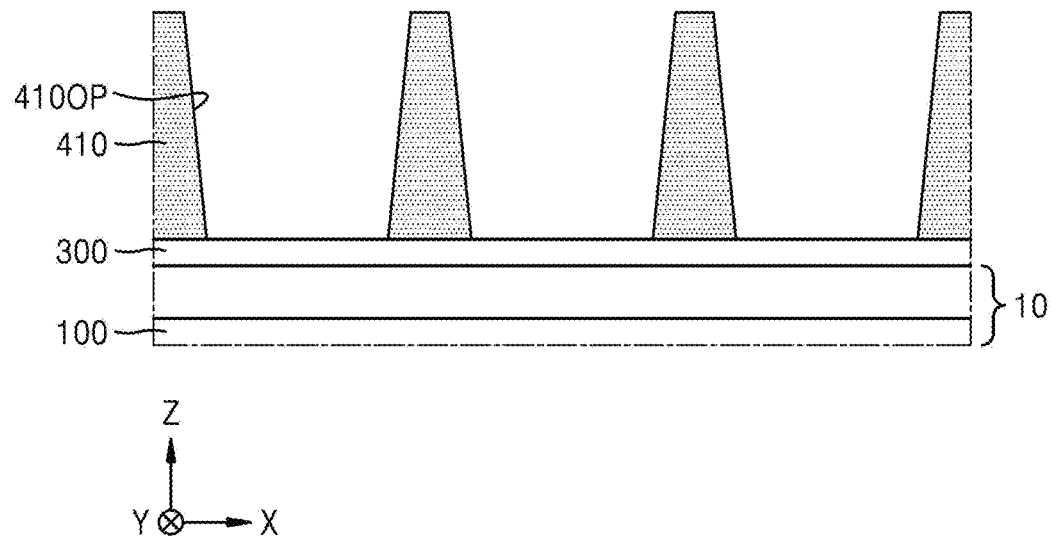

Referring to FIG. 4B, openings respectively corresponding to the first to third light-emitting elements 210, 220, and 230 may be formed in the organic film 410m to form an organic pattern layer. In this case, the organic pattern layer may be the first light blocking layer 410, and the openings may be the first openings 410OP of the first light blocking layer 410. In the process of forming the organic pattern layer, a photolithography process may be used as an example. As another example, a nanoimprint lithography may be used. As described above, the first light blocking layer 410 including the first openings 410OP respectively corresponding to the first to third light-emitting elements 210, 220, and 230 may be formed through the process described with reference to FIGS. 4A and 4B.

Figure 4C:
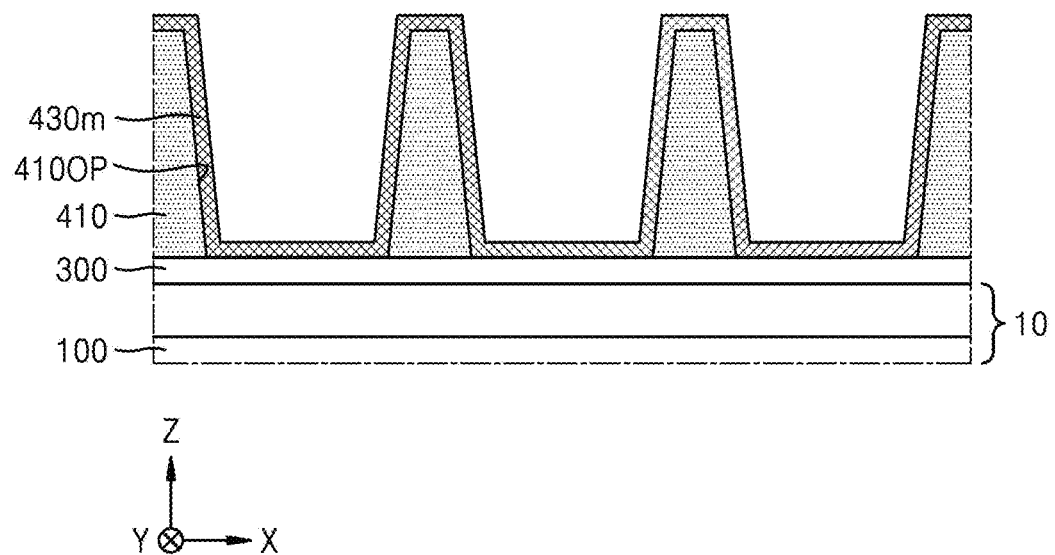

Referring to FIG. 4C, in order to form a reflective layer 430 on the first light blocking layer 410, first, a metal layer 430m may be formed on the entire surface of the organic pattern layer. A method of forming the metal layer 430m may be used without limitation as long as it is a method capable of depositing metal. For example, a chemical vapor deposition method, an atomic layer deposition method, a sputtering method, an electric discharge method, a plasma deposition method, a thermochemical vapor deposition method, an electron beam deposition method, and the like may be used as the method of forming the metal layer 430*m*. According to some example embodiments, the metal layer 430*m* may be precisely deposited using the sputtering method or the electron beam deposition method.

The metal layer 430*m* may include a metal material having reflectance, such as Ag, Al, Au, or a combination thereof. The thickness of the metal layer 430*m* may be greater than the thickness of the reflective layer 430 to be finally formed. According to some example embodiments, the metal layer 430*m* may be deposited to a thickness of 20 nm or more and 140 nm or less.

Figure 4D:
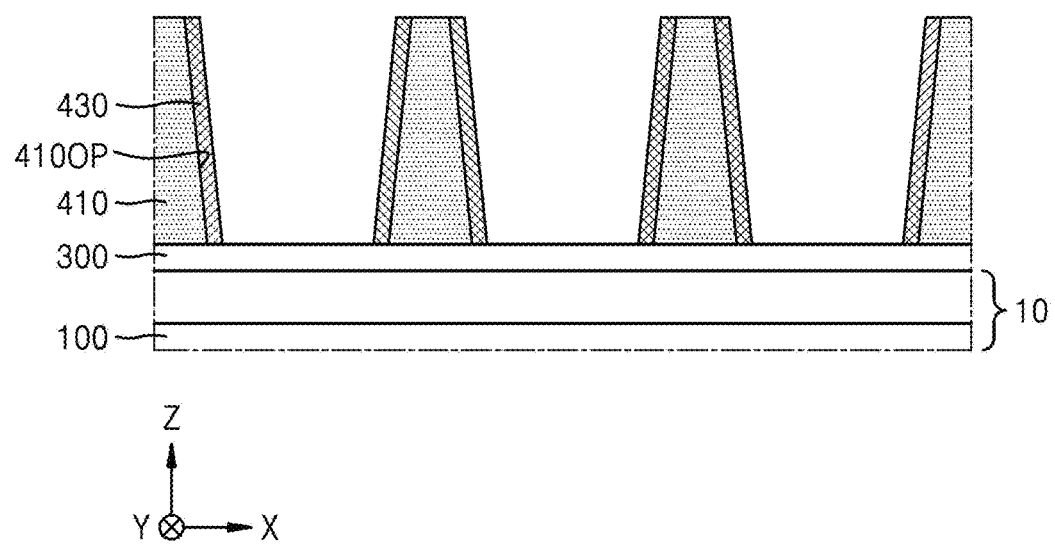

Referring to FIG. 4D, by removing a portion of the metal layer 430*m*, the metal layer 430*m* on the inner surface of an opening of the organic pattern layer, that is, the inner surface of the first opening 410OP of the first light blocking layer 410, may be left. Through this, the reflective layer 430 covering the inner surface of the first opening 410OP may be formed. According to some example embodiments, the process of removing a portion of the metal layer 430*m* may include a process of etching the metal layer 430*m* through ion milling. In addition, as the metal layer 430*m* located at the bottom of the first opening 410OP is etched, metal particles detached from the metal layer 430*m* may be attached to the inner surface of the first opening 410OP to form the reflective layer 430. The thickness of the reflective layer 430 formed finally may be 20 nm or more and 100 nm or less, and the aspect ratio of the reflective layer 430 may be 1 or more and 20 or less. The process of forming the reflective layer 430 will be described in more detail with reference to FIGS. 5A and 5B below.

Figure 4E:
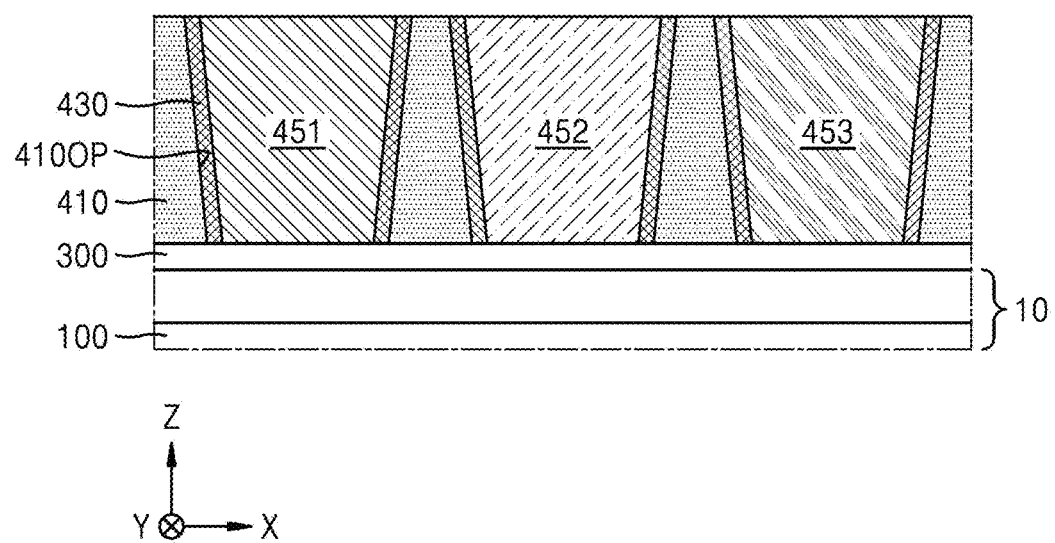

Referring to FIG. 4E, a first color conversion layer 451, a second color conversion layer 452, and a light transmission layer 453 may be formed in the first openings 410OP of the first light blocking layer 410. The first color conversion layer 451, the second color conversion layer 452, and the light transmission layer 453 may overlap the first to third light-emitting elements 210, 220, and 230, respectively. Because the reflective layer 430 is formed only on the inner surface of the first opening 410OP, each of the first color conversion layer 451, the second color conversion layer 452, and the light transmission layer 453 may contact the encapsulation layer 300 located on one side thereof.

The first color conversion layer 451, the second color conversion layer 452, and the light transmission layer 453 may be formed by a spin coating or inkjet printing method, through which the amount of wasted photosensitive polymer, scattering particles, and quantum dot forming material may be reduced.

Figure 4F:
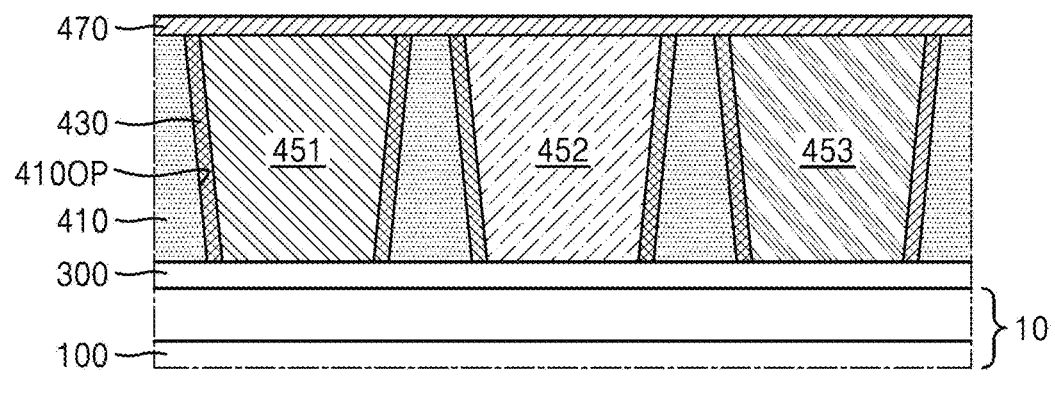
Figure 4F:
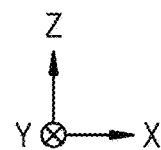

Referring to FIG. 4F, a first capping layer 470 may be formed to cover the first color conversion layer 451, the second color conversion layer 452, and the light transmission layer 453. The first capping layer 470 may be integral over the entire surface of the first substrate 100. The first capping layer 470 may be located on the first light blocking layer 410. For example, because the reflective layer 430 is arranged only on the inner surface of the first opening 410OP of the first light blocking layer 410, the first capping layer 470 may contact one surface of the blocking layer 410 facing the opposite side of the first substrate 100. In addition, the first capping layer 470 may contact one surface of each of the first color conversion layer 451, the second color conversion layer 452, and the light transmission layer 453, which face the opposite side of the first substrate 100.

The first capping layer 470 may be formed using a chemical vapor deposition method or the like. For example, a low-temperature chemical vapor deposition method of approximately 200° C. or less may be used such that the first color conversion layer 451, the second color conversion layer 452, and the light transmission layer 453 formed earlier are not damaged.

Figure 4G:
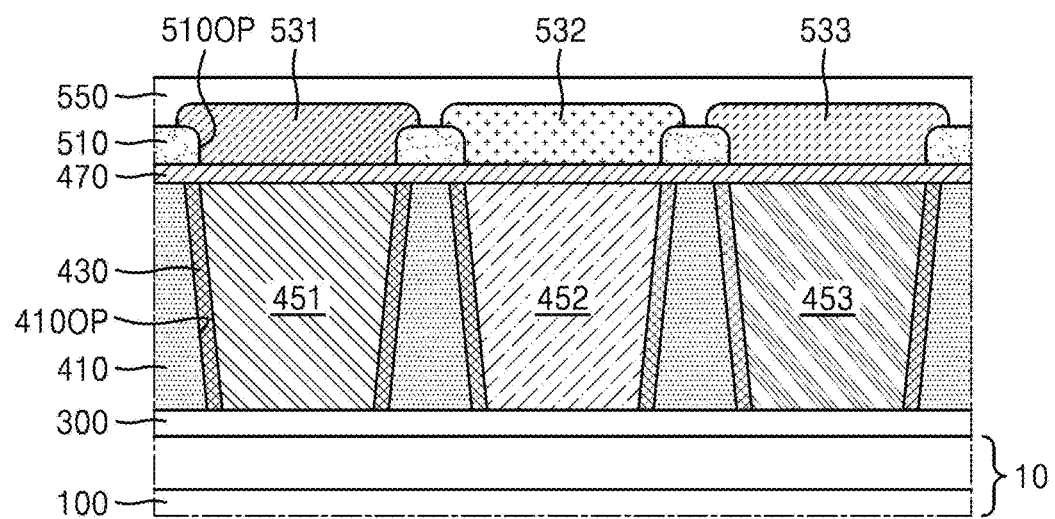
Figure 4G:
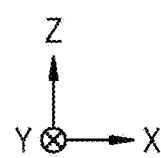

Referring to FIG. 4G, a second light blocking layer 510, which overlaps the first light blocking layer 410 and includes second openings 510OP overlapping the first openings 410OP, may be formed on the first capping layer 470. Thereafter, first to third color filter layers 531, 532, and 533 respectively corresponding to the first color conversion layer 451, the second color conversion layer 452, and the light transmission layer 453 may be formed in the second openings 510OP.

A method of forming the second light blocking layer 510 may be used without limitation as long as it is a method capable of forming a polymer layer. For example, the second light blocking layer 510 may be formed by applying a material for the second light blocking layer 510 on the first capping layer 470 and then forming the second openings 510OP at positions respectively corresponding to the first openings 410OP. For example, a method of applying the material for the second light blocking layer 510 may use inkjet printing, spin coating, or spray coating. Also, the second opening 510OP may be formed through, for example, a photolithography process.

After the second light blocking layer 510 is formed, a material for color filters may be filled in the second openings 510OP of the second light blocking layer 510 to form the first to third color filter layers 531, 532, and 533. For example, the first to third color filter layers 531, 532, and 533 may be formed using inkjet printing, spin coating, or spray coating.

In addition, a second capping layer 550 may be formed on the second light blocking layer 510 and the first to third color filter layers 531, 532, and 533. The second capping layer 550 may contact the first to third color filter layers 531, 532, and 533. The second capping layer 550 may be formed using a chemical vapor deposition method or the like. For example, a low-temperature chemical vapor deposition method of approximately 200° C. or less may be used such that the first to third color filter layers 531, 532, and 533 formed earlier are not damaged.

As described above, the display device 1 according to some example embodiments may be provided through the process described with reference to FIGS. 4A to 4G.

Figure 5A:
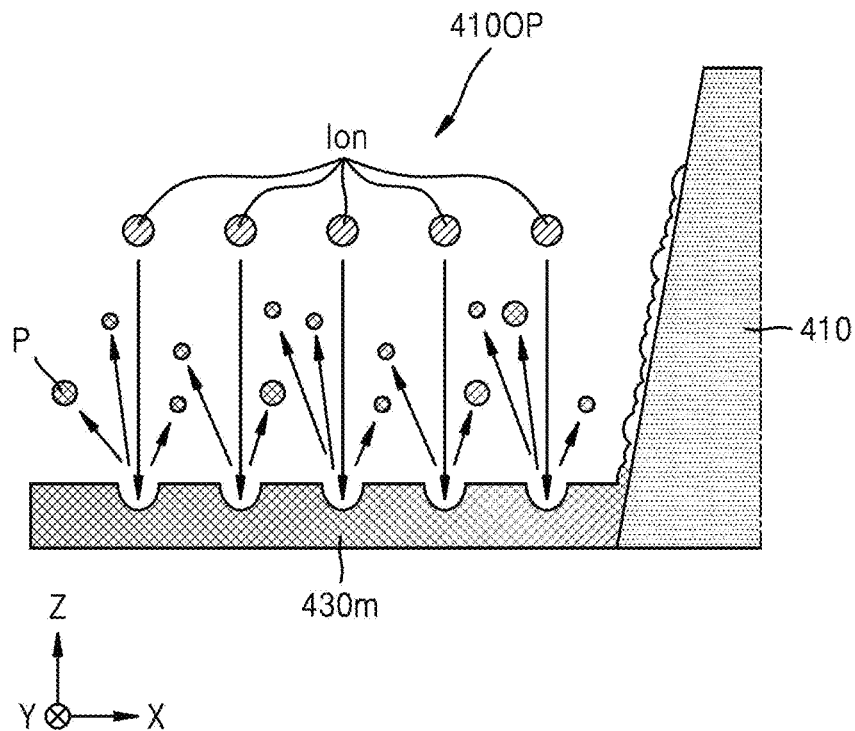
FIGS. 5A and 5B are schematic cross-sectional views illustrating some of the processes of manufacturing a portion of a display device according to some example embodiments.
Figure 5B:
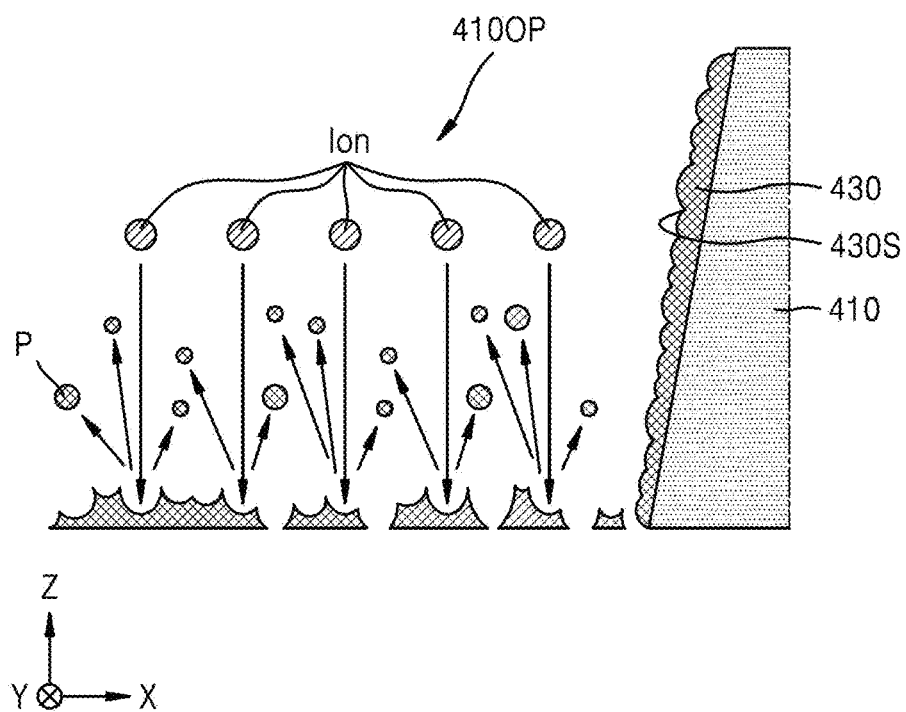

FIGS. 5A and 5B are schematic cross-sectional views illustrating some of the processes of manufacturing a portion of a display device according to some example embodiments. Specifically, FIGS. 5A and 5B are schematic cross-sectional views illustrating a process of forming a reflective layer of an optical panel of a display device. FIGS. 5A and 5B show a cross section of a portion of a second light blocking layer.

Referring to FIG. 5A, first, a metal layer 430*m* may be formed in a first opening 410OP of a first light blocking layer 410, and an etching process may be used to remove the metal layer 430*m* formed on the bottom of the first opening 410OP. According to some example embodiments, the etching process may use ion milling. The ion milling may be performed by accelerating ions of an inert gas to continuously collide the accelerated ions Ion with the surface of the metal layer 430*m*. The inert gas may be selected from nitrogen, helium, argon or a mixture gas thereof. In this case, ions may be accelerated using a voltage difference.

In order to form a reflective layer 430 simultaneously with the etching of the metal layer 430*m*, an ion bombardment phenomenon may be used. When the accelerated ions Ion collide with the surface of the metal layer 430m and physically bombard metal particles present on the surface of the metal layer 430m, the bombarded metal particles P may be detached from the surface of the metal layer 430m. The metal particles P detached from the metal layer 430m may be thrown out at various angles, and some of them may be attached to the inner surface of the first opening 410OP.

Referring to FIG. 5B, by continuing the ion milling for a period of time, the metal layer 430m located at the bottom of the first opening 410OP may be removed, and at the same time, the metal particles P detached from the metal layer 430m may be accumulated while being continuously attached to the inner surface of the first opening 410OP. Through this, a reflective layer 430 by the metal particles P may be formed on the inner surface of the first opening 410OP. Irregularities caused by the metal particles P may be formed on a surface 430S of the reflective layer 430.

As a comparative example, when a reflective layer is formed by a photolithography process using a wet etch, a manufacturing cost may increase due to the use of an expensive mask, and manufacturing defects and quality defects may be caused by misalignment of the mask and damage to the reflective layer 430 due to the wet etch. In addition, there is a problem that processes are complicated and thus the manufacturing cost may be excessive.

However, in the case of forming a reflective layer by using ion milling and ion bombardment according to some example embodiments, a process using a mask is unnecessary, and thus, a manufacturing cost may be reduced and a misalignment problem of the mask does not occur. In addition, damage to the reflective layer 430 may be prevented to reduce manufacturing quality defects. Furthermore, the complicated photolithography process may be simplified, thereby obtaining cost savings.

In addition, in the case of forming a reflective layer by using ion milling and ion bombardment according to some example embodiments, the surface 430S of the reflective layer 430 may necessarily include irregularities, whereby light reaching the reflective layer 430 may be diffusely reflected. Because the light is diffusely reflected at various angles, the reflected light may be excited by quantum dots in a wider area in a color conversion layer and color may be converted. Through this, light conversion efficiency may be improved.

Figure 6:
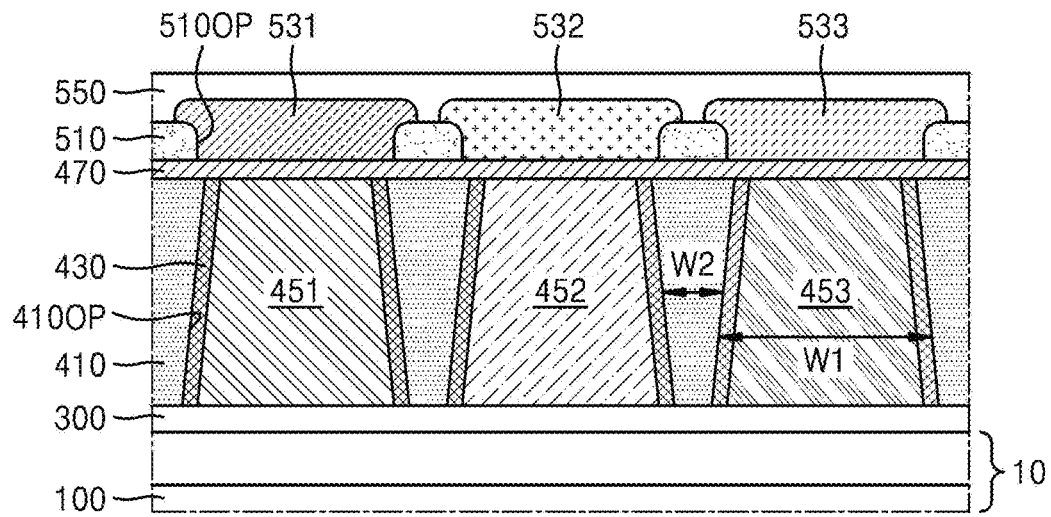
FIG. 6 is a schematic cross-sectional view illustrating a portion of a display device according to some example embodiments.
Figure 6:
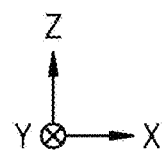

FIG. 6 is a schematic cross-sectional view illustrating a portion of a display device according to some example embodiments. The same description as the structure described with reference to FIG. 3 will be omitted, and the following description will mainly focus on differences.

Referring to FIG. 6, a width W1 of a first opening 410OP of a first light blocking layer 410 may decrease toward a light exit direction, that is, a +z direction, from a first substrate 100. To this end, when the organic pattern layer described above with reference to FIG. 4B is formed, the organic pattern layer may be formed such that a width W2 of a portion of the first light blocking layer 410 located between the first openings 410OP adjacent to each other increases in the +z direction.

Through the configuration of FIG. 6, when a reflective layer 430 is formed using ion milling and ion bombardment, the reflective layer 430 on the inner surface of the first opening 410OP may be more uniformly formed. Because the width W1 of the first opening 410OP narrows in the +z direction, metal particles detached from a metal layer 430m deposited on an encapsulation layer 300 may better reach the inner surface of the first opening 410OP. Therefore, the metal particles may be more uniformly attached to the inner surface of the first opening 410OP. Through this, the uniformity of the thickness of the reflective layer 430 may be improved, and an optimal reflectance may be secured in the reflective layer 430 as a whole.

Figure 7:
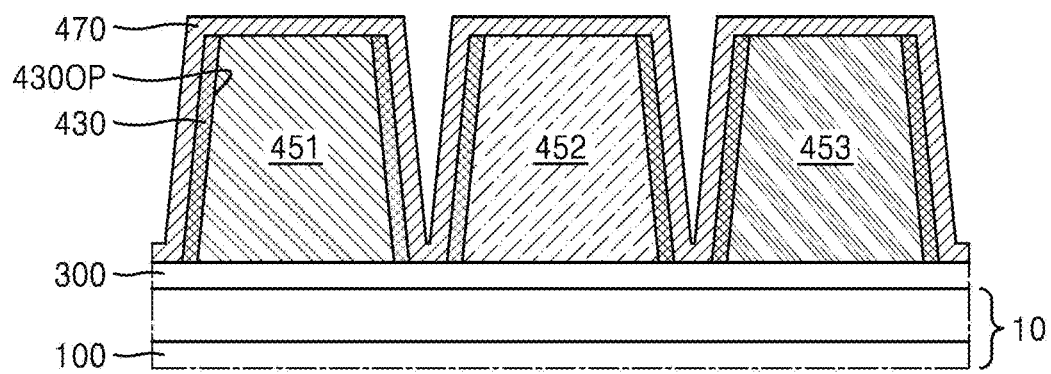
FIG. 7 is a schematic cross-sectional view illustrating a portion of a display device according to some example embodiments.
Figure 7:
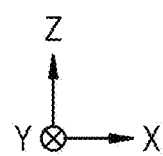

FIG. 7 is a schematic cross-sectional view illustrating a portion of a display device according to some example embodiments. The same description as the structure described with reference to FIG. 3 will be omitted, and the following description will mainly focus on differences.

Referring to FIG. 7, the display device may include a reflective layer 430 surrounding, on a plane, each of a first color conversion layer 451, a second color conversion layer 452, and a light transmission layer 453, which are arranged on a display layer 10. A second inorganic encapsulation layer 330 of an encapsulation layer 300 may cover one side of each of the first color conversion layer 451, the second color conversion layer 452, and the light transmission layer 453, which face the first substrate 100. A first capping layer 470 may cover the other side of each of the first color conversion layer 451, the second color conversion layer 452, and the light transmission layer 453 and cover the reflective layer 430. A light blocking layer may not be arranged between reflective layers 430 adjacent to each other, and thus, the first capping layer 470 and the second inorganic encapsulation layer 330 may contact each other between the reflective layers 430.

Such a configuration may be provided by further performing a process of removing a first light blocking layer 410 after forming the reflective layer 430 on the inner surface of a first opening 410OP of the first light blocking layer 410. By omitting the first light blocking layer 410, an interval among the first color conversion layer 451, the second color conversion layer 452, and the light transmission layer 453 may be reduced, and thus, a high-resolution display device may be provided.

Figure 8:
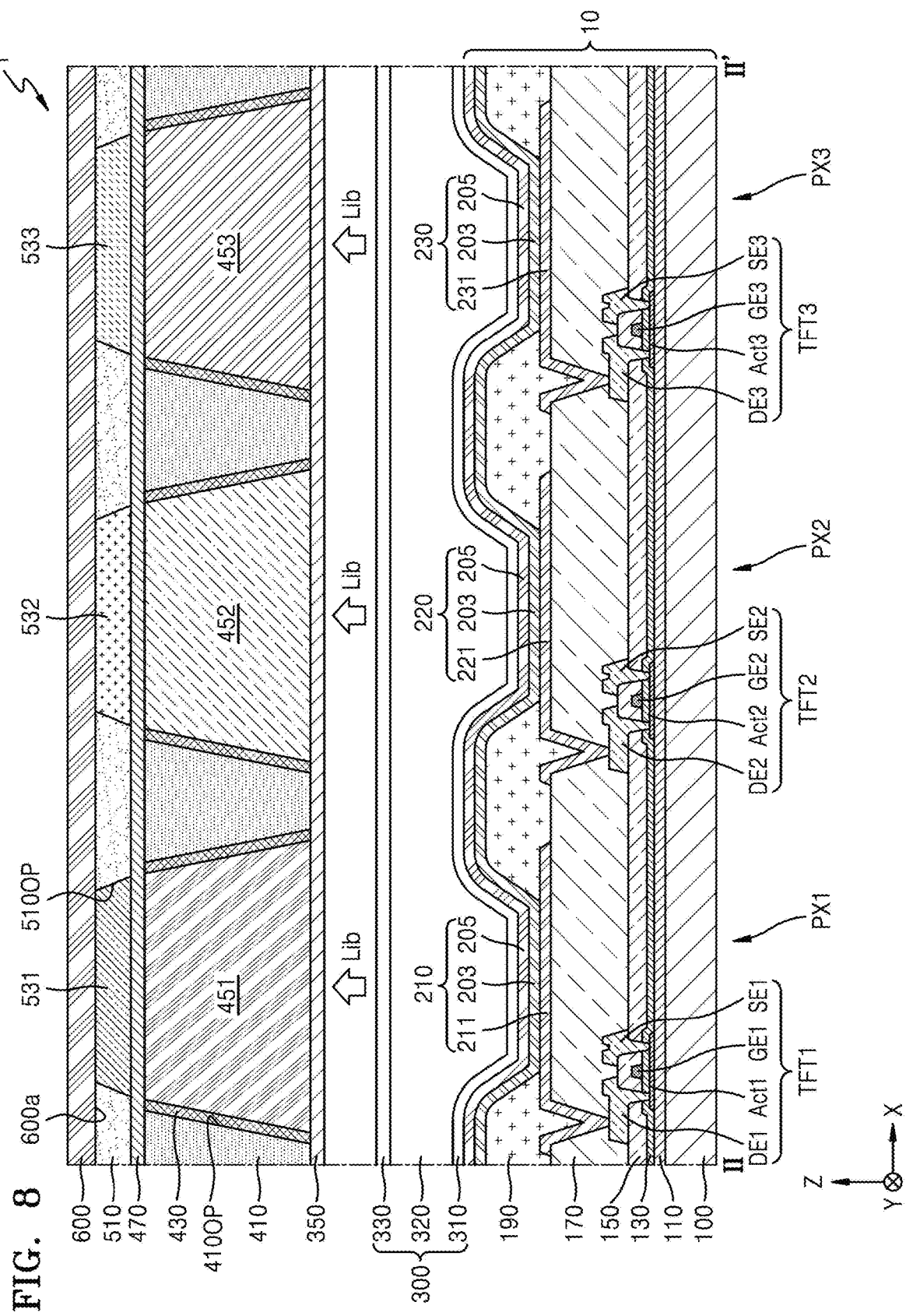
FIG. 8 is a schematic cross-sectional view illustrating a display device according to some example embodiments.

FIG. 8 is a schematic cross-sectional view illustrating a display device 1 according to some example embodiments. The same description as the structure described with reference to FIG. 3 will be omitted, and the following description will mainly focus on differences.

Referring to FIG. 8, the display device 1 may include a second substrate 600 facing a first substrate 100. The second substrate 600 may include glass, metal, or polymer resin.

The second substrate 600 may be arranged above one side of the first substrate 100 such that first to third light-emitting elements 210, 220, and 230 are located therebetween. The second substrate 600 may cover a second light blocking layer 510 and first to third color filter layers 531, 532, and 533. It may be understood that the second light blocking layer 510 and the first to third color filter layers 531, 532, and 533 are formed on one surface 600a of the second substrate 600, and the one surface 600a may be a surface facing the first substrate 100 from among both surfaces of the second substrate 600.

For example, a first capping layer 470, a first light blocking layer 410, a reflective layer 430, a first color conversion layer 451, a second color conversion layer 452, a light transmission layer 453, and a third capping layer 350 may be arranged on the first to third color filter layers 531, 532, and 533. In this case, a display layer 10 may be directly adhered, by a transparent adhesive layer, to the second substrate 600 and stacked structures formed on the second substrate 600. The stacked structures include the first to third color filter layers 531, 532, and 533, the second light blocking layer 510, the first capping layer 470, the first color conversion layer 451, the second color conversion layer 452, the light transmission layer 453, the reflective layer 430, the first light blocking layer 410, and the third capping layer 350. Alternatively, a filling layer including a transmissive insulating layer or an air layer may be further provided between the display layer 10 and the stacked structures.

As another example, among the stacked structures, the second light blocking layer 510 and the first to third color filter layers 531, 532, and 533 may be stacked on the second substrate 600, and the first light blocking layer 410, the reflective layer 430, the first color conversion layer 451, the second color conversion layer 452, and the light transmission layer 453 may be stacked on the display layer 10 and the encapsulation layer 300.

Figure 9A:
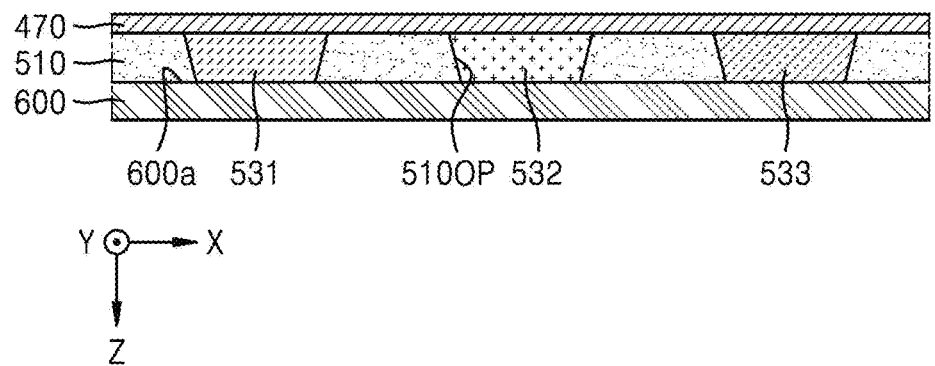
FIGS. 9A and 9B are schematic cross-sectional views illustrating some of the processes of a method of manufacturing the display device of FIG. 8.
Figure 9B:
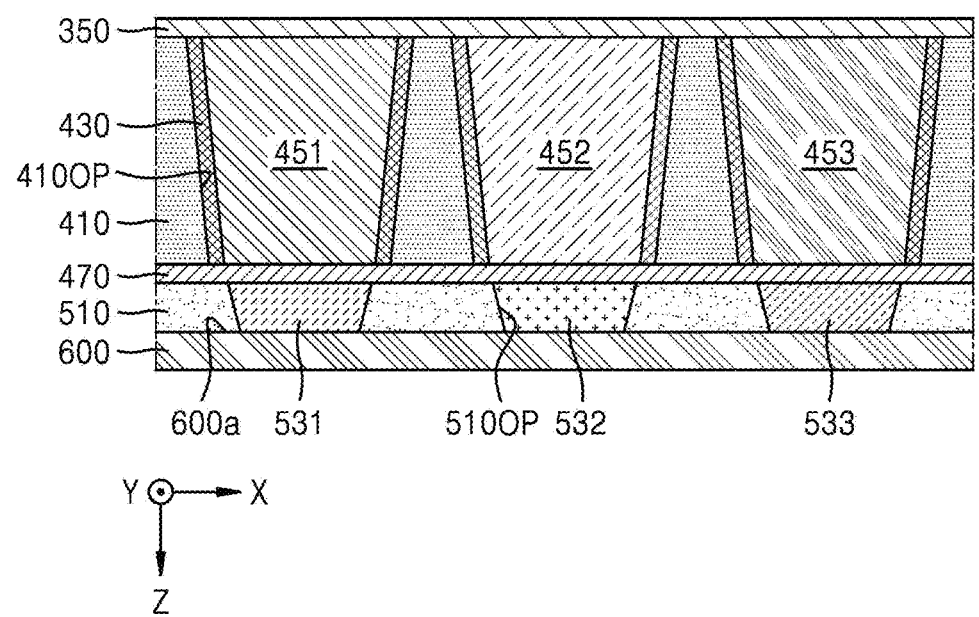

FIGS. 9A and 9B are schematic cross-sectional views illustrating some of the processes of a method of manufacturing the display device 1 of FIG. 8. FIGS. 9A and 9B shows states in which the second substrate 600 of FIG. 8 is inverted 180 degrees.

Referring to FIG. 9A, first, a second substrate 600, in which first to third color filter layers 531, 532, and 533 respectively corresponding to the first to third light-emitting elements 210, 220, and 230 are formed, may be prepared. According to some example embodiments, a second light blocking layer 510 including second openings 510OP may be formed on one surface 600a of the second substrate 600, and then the first to third color filter layers 531, 532, and 533 may be formed in second openings 510OP. Then, a second capping layer 550 may be formed on the second light blocking layer 510 and the first to third color filter layers 531, 532, and 533. A method of forming the second light blocking layer 510, the first to third color filter layers 531, 532, and 533, and the second capping layer 550 may be the same as described with reference to FIG. 4G.

Referring to FIG. 9B, a first light blocking layer 410, a reflective layer 430, a first color conversion layer 451, a second color conversion layer 452, and a light transmission layer 453 may be formed on the second capping layer 550. A method and order of forming the first light blocking layer 410, the reflective layer 430, the first color conversion layer 451, the second color conversion layer 452, and the light transmission layer 453 may be the same as described above with reference to FIGS. 4A to 4E.

Thereafter, a third capping layer 350 may be formed on the first color conversion layer 451, the second color conversion layer 452, and the light transmission layer 453. The third capping layer 350 may include an inorganic insulating material such as silicon nitride, silicon oxide, or silicon oxynitride. The third capping layer 350 may be arranged to face the first capping layer 470 to sandwich the first color conversion layer 451, the second color conversion layer 452, and the light transmission layer 453 therebetween. Through this, the first and second color conversion layers 451 and 452 may be covered by the third capping layer 350 such that moisture and oxygen do not flow into quantum dots in the first and second color conversion layers 451 and 452.

Figure 10A:
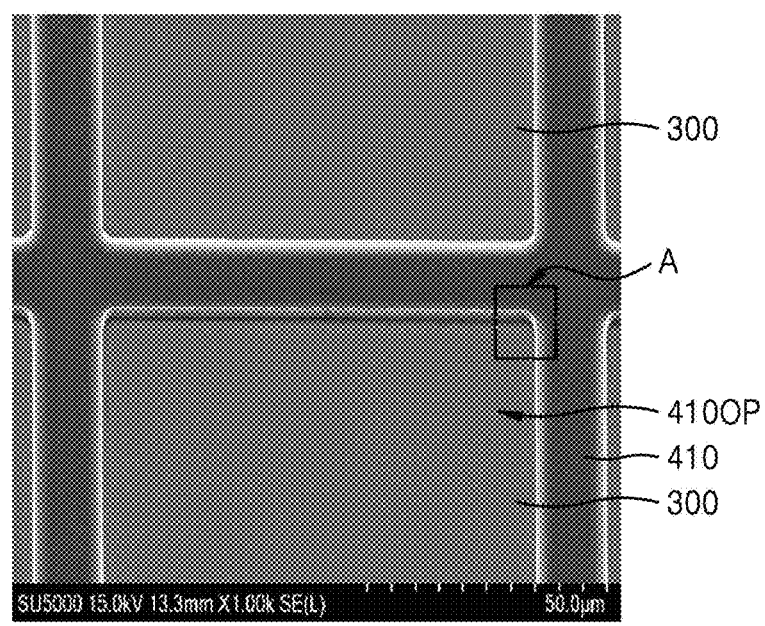
FIGS. 10A to 10C are images showing a portion of a display device according to some example embodiments.
Figure 10B:
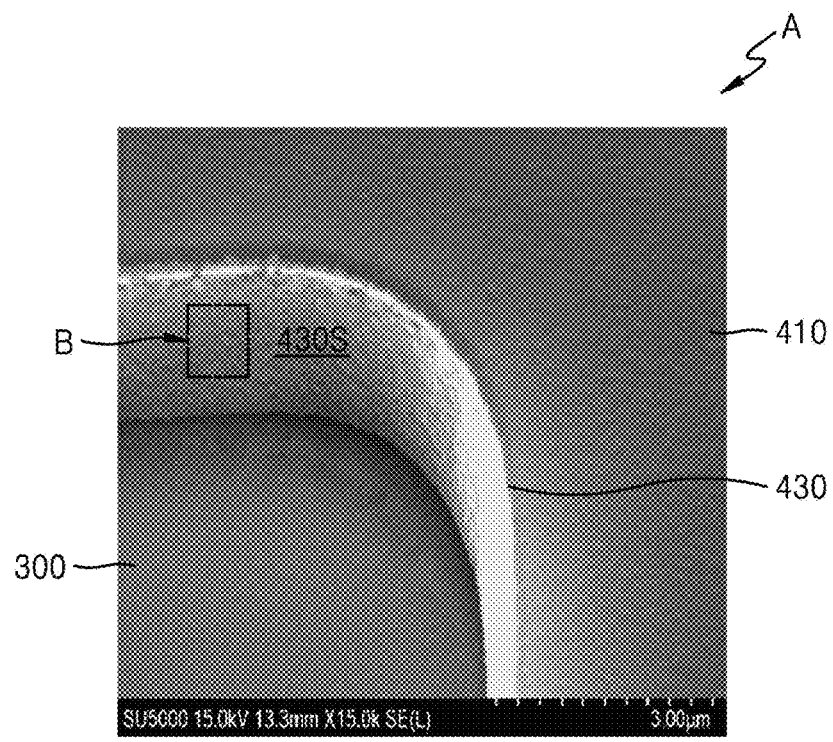
Figure 10C:
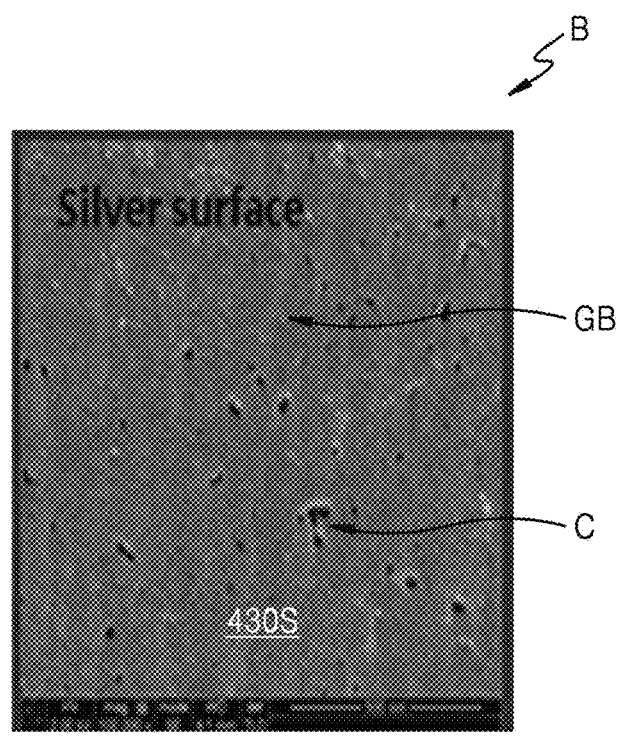

FIGS. 10A to 10C are images showing a portion of a display device according to some example embodiments. The images of FIGS. 10A to 10C may correspond to a portion of the display device in the process of FIG. 4D.

FIG. 10A shows a portion of the first light blocking layer 410 formed on the display layer 10 and including the first opening 410OP. Because a color conversion layer or a light transmission layer has not been formed in the first opening 410OP, the encapsulation layer 300 may be visible in a region exposed by the first opening 410OP. In FIG. 10A, the first opening 410OP is illustrated as a rectangle with a round vertex on a plane, but this is an example. The first opening 410OP and the first light blocking layer 410 may have various shapes and be variously arranged.

FIG. 10B shows a portion of the reflective layer 430 formed on the inner surfaces of the first light blocking layer 410 and the first opening 410OP. FIG. 10B may correspond to area A of FIG. 10A. Referring to FIG. 10B, a reflective layer 430 may be arranged on the inner surface of the first opening 410OP. According to some example embodiments, the reflective layer 430 may have a thickness of 20 nm or more and 100 nm or less and may have an aspect ratio of 1 or more and 20 or less. The reflective layer 430 may have an thickness and a high aspect ratio so as to secure a high reflectance and at the same time sufficiently secure an area in which a color conversion layer or a light transmission layer is arranged.

FIG. 10C shows a portion of the surface 430S of the reflective layer 430. FIG. 10C may correspond to area B of FIG. 10B. Referring to FIG. 10C, according to some example embodiments, the reflective layer 430 may include Ag. The reflective layer 430 may have a surface 430S on which irregularities are formed. A grain boundary or cluster may be formed on the surface 430S.

The grain boundary and the cluster may be formed by forming a reflective layer 430 using ion milling and ion bombardment. The metal particles P detached from the metal layer 430m may be accumulated while being continuously attached to the inner surface of the first opening 410OP, and when the growth surfaces of the metal particles P come into contact with each other, a boundary surface, that is, a grain boundary may be formed. In addition, large metal particles and small metal particles may be detached from the metal layer 430m, and a cluster may be formed as the metal particles P of various sizes are locally aggregated and accumulated on the inner surface of the first opening 410OP.

When irregularities are formed on the surface 430S of the reflective layer 430 due to a grain boundary or cluster, light travelling toward the inner surface of the first opening 410OP may be diffusely reflected by the reflective layer 430. Because the light is diffusely reflected at various angles, the reflected light may be excited by quantum dots in a wider area in a color conversion layer and color may be converted. Through this, light conversion efficiency may be improved.

Figure 11:
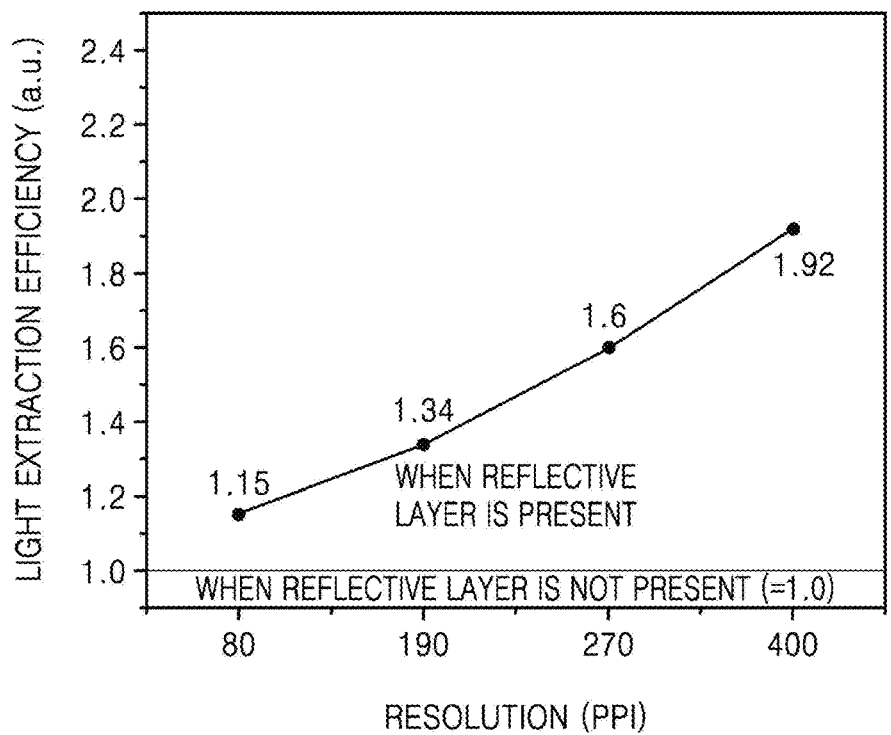
FIG. 11 is a graph for comparing light extraction efficiencies with and without a reflective layer in display devices according to some example embodiments.

FIG. 11 is a graph for comparing light extraction efficiencies with and without a reflective layer in display devices according to embodiments.

In the graph of FIG. 11, the horizontal axis represents resolution, and the vertical axis represents light extraction efficiency. The unit of resolution is pixels per inch (PPI). The unit of light extraction efficiency is an arbitrary unit (a.u.). The arbitrary unit (a.u.) means a relative value of light extraction efficiency in the case where a reflective layer is present when the light extraction efficiency in the case where a reflective layer is not present is a reference value of 1.0.

Referring to FIG. 11, it may be seen that the light extraction efficiency is further improved when a reflective layer is provided. Furthermore, the higher the resolution of the display device 1, the greater the improvement in the light extraction efficiency due to the provision of the reflective layer 430. When the first light blocking layer 410 is present, as the resolution of the display device 1 increases, an area ratio of an area occupied by the first light blocking layer 410 to the entire area of the display device 1 may increase, and an area ratio of the first opening 410OP, in which a color conversion layer and a light transmission layer is located, to the entire area may decrease. In other words, as the resolution increases, the width of the first opening 410OP of the first light blocking layer 410 may decrease, and thus, optical loss may increase. Accordingly, when the reflective layer 430 is provided, the higher the resolution of the display device 1, the greater the contribution of the reflective layer 430 to the light extraction efficiency and light conversion efficiency increase. Therefore, in the case of manufacturing a high-resolution display device, by providing the reflective layer 430 according to some example embodiments, it may be possible to provide the display device 1 with relatively improved display quality.

FIGS. 12A to 12D are graphs showing a relationship between a wavelength and reflectance according to a material and a thickness of a reflective layer in a display device according to some example embodiments.

Figure 12A:
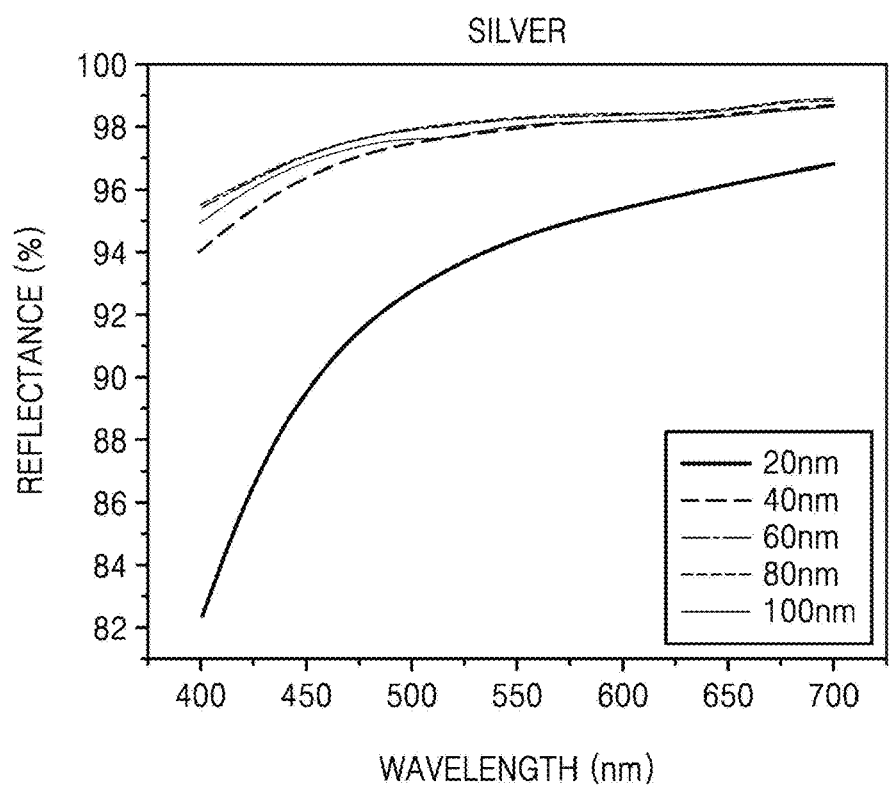
FIGS. 12A to 12D are graphs showing a relationship between a wavelength and reflectance according to a material and a thickness of a reflective layer in a display device according to some example embodiments.

FIG. 12A shows reflectance according to the wavelength of light when the reflective layer 430 includes Ag and thicknesses of the reflective layer 430 are 20 nm, 40 nm, 60 nm, 80 nm, and 100 nm, respectively. Referring to FIG. 12A, it may be seen that as the wavelength of light increases, the reflectance of the reflective layer 430 generally increases. As the thickness of the reflective layer 430 becomes greater than 20 nm, the reflective layer 430 may have a high reflectance. However, when the reflective layer 430 has a thickness of 100 nm, the reflectance thereof may be lower than when the reflective layer 430 has a thickness that is less than 100 nm. Accordingly, when the reflective layer 430 includes Ag, the thickness of the reflective layer 430 may be greater than 20 nm and less than 100 nm, and advisably about 60 nm to about 80 nm.

Figure 12B:
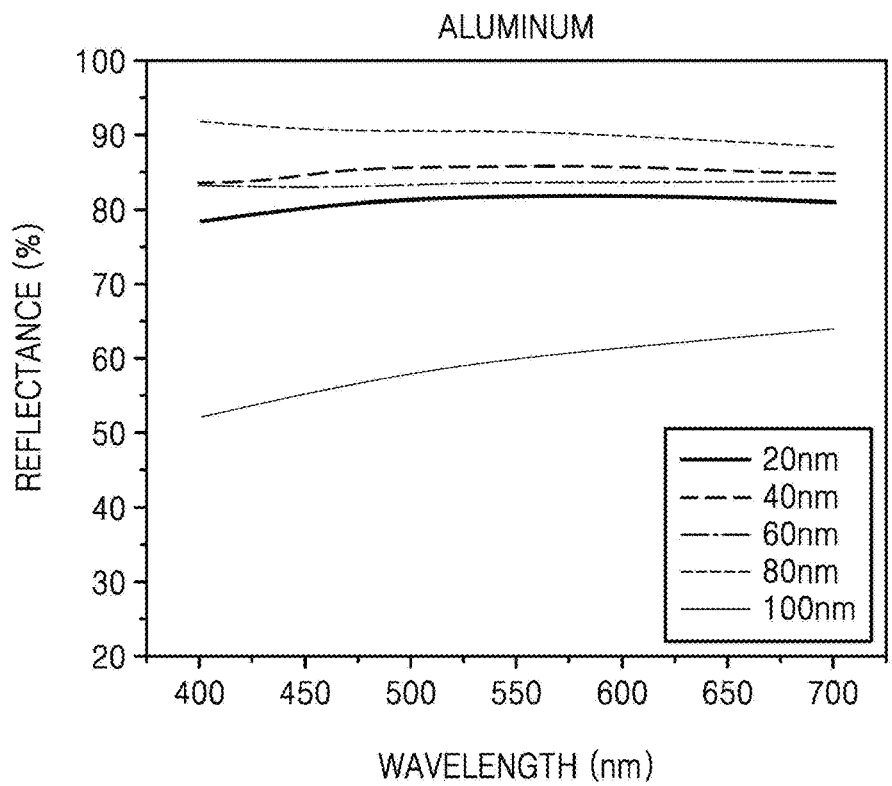

FIG. 12B shows reflectance according to the wavelength of light when the reflective layer 430 includes Al and thicknesses of the reflective layer 430 are 20 nm, 40 nm, 60 nm, 80 nm, and 100 nm, respectively. Referring to FIG. 12B, when the thickness of the reflective layer 430 is 80 nm, the reflective layer 430 may have a high reflectance. On the other hand, when the thickness of the reflective layer 430 is 100 nm, the reflective layer 430 may have a relatively low reflectance. When the reflective layer 430 includes Al, the thickness of the reflective layer 430 may be greater than 60 nm and less than 100 nm, and advisably about 80 nm.

Figure 12C:
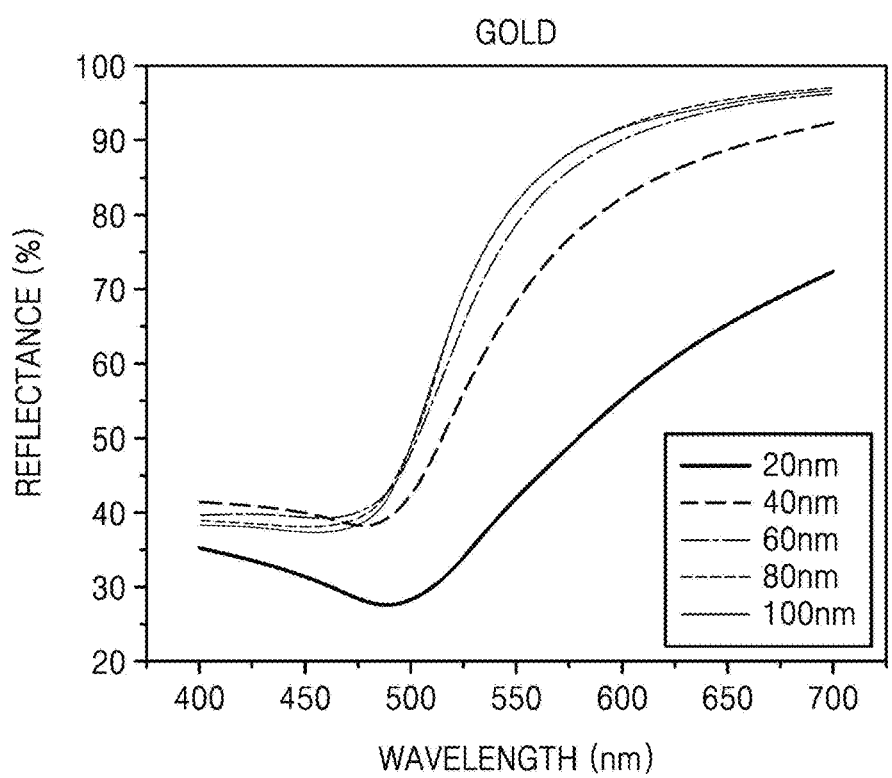

FIG. 12C shows reflectance according to the wavelength of light when the reflective layer 430 includes Au and thicknesses of the reflective layer 430 are 20 nm, 40 nm, 60 nm, 80 nm, and 100 nm, respectively. Referring to FIG. 12C, as the thickness of the reflective layer 430 increases, the reflective layer 430 may generally have a high reflectance. When the reflective layer 430 includes Au, the thickness of the reflective layer 430 may be greater than 60 nm, and advisably about 80 nm to about 100 nm.

Figure 12D:
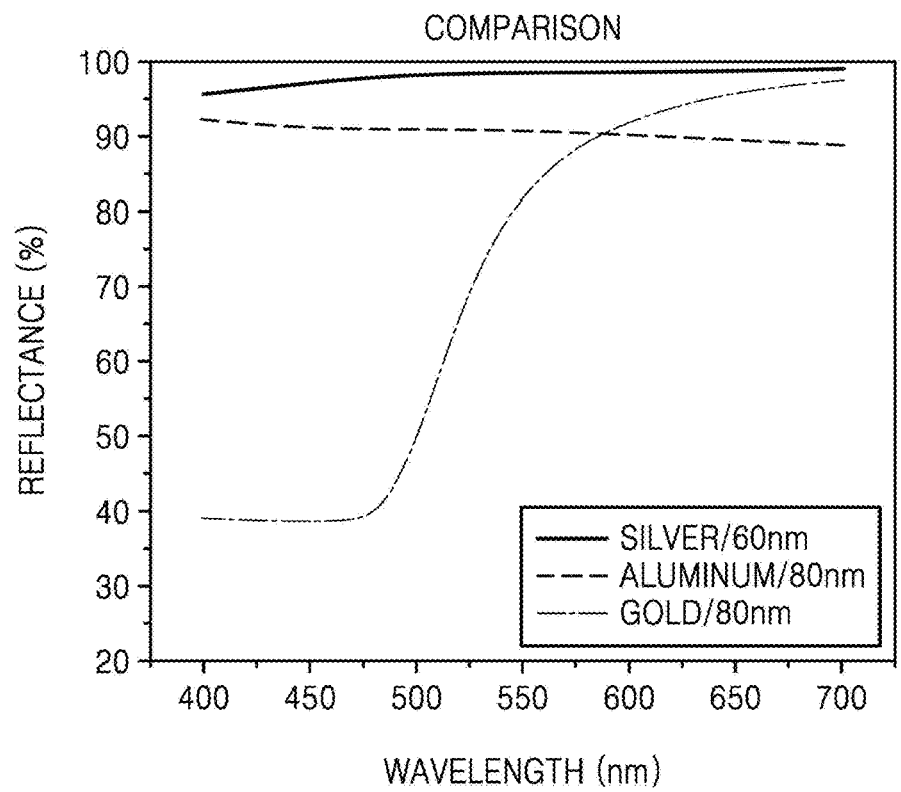

FIG. 12D shows reflectance according to the light wavelength when the reflective layer 430 includes Ag and has a thickness of 60 nm, when the reflective layer 430 includes Al and has a thickness of 80 nm, and when the reflective layer 430 includes Au and has a thickness of 80 nm. Referring to FIG. 12D, when the reflective layer 430 includes Ag and has a thickness of 60 nm, the reflective layer 430 may have a high reflectance as a whole in a visible wavelength band. Therefore, according to some example embodiments, the reflective layer 430 may include Ag and have a thickness of about 60 nm.

Figure 13:
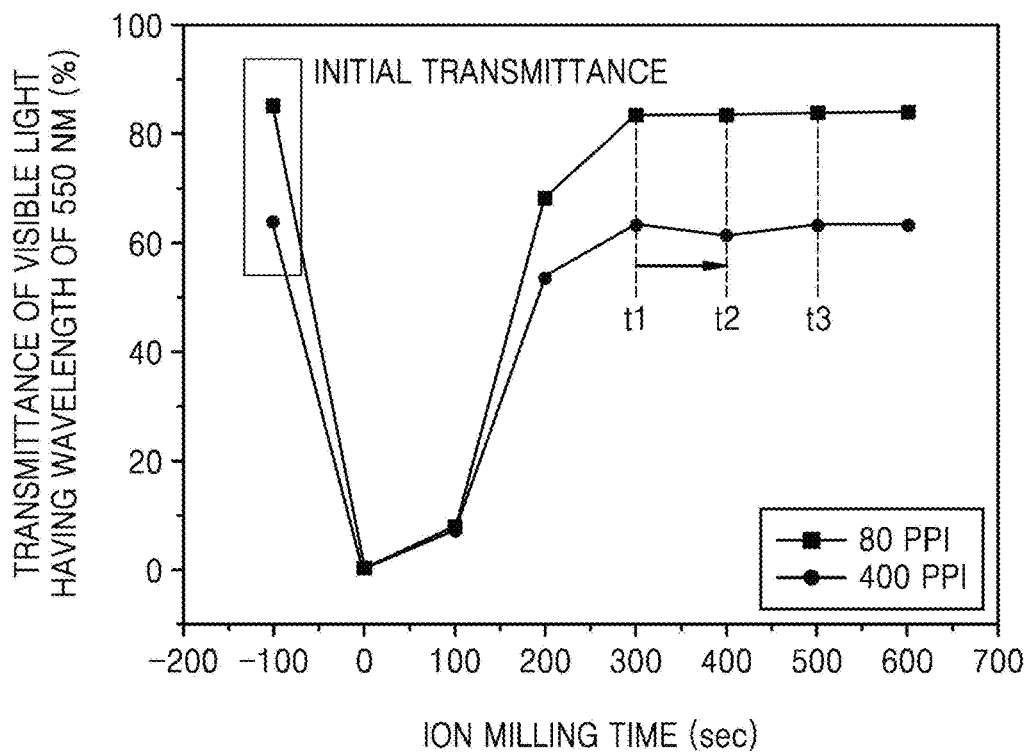
FIG. 13 is a graph showing a relationship between ion milling time of a metal layer and transmittance of visible light in a manufacturing process of a portion of a display device according to some example embodiments.

FIG. 13 is a graph showing a relationship between ion milling time of a metal layer and transmittance of visible light in a manufacturing process of a portion of a display device according to some example embodiments.

The graph of FIG. 13 shows a relationship between ion milling time of the metal layer 430m and transmittance of visible light having a wavelength of 550 nm when resolutions are designed to 80 PPI and 400 PPI, respectively. The horizontal axis represents the ion milling time, that is, a time required for performing ion milling, and the unit of the horizontal axis is second (sec). The vertical axis represents light transmittance, and the unit of the vertical axis is percent (%). The light transmittance may be obtained by measuring the ion milling time every 100 seconds. In this case, the metal layer 430m may be formed on the first light blocking layer 410 to a thickness of 60 nm and may include Ag.

The initial transmittance shown in the graph of FIG. 13 refers to light transmittance in a state before forming the metal layer 430m on the first light blocking layer 410 during the manufacturing process of the display device. When the resolution is 80 PPI, the light transmittance may be between about 80% and about 90%, and when the resolution is 400 PPI, the light transmittance may be between about 60% and about 70%. As the resolution increases, the ratio of the area occupied by the opening of the first light blocking layer 410 in the display device 1 decreases, and thus, the light transmittance may decrease.

When the metal layer 430m is formed on the first light blocking layer 410, the light transmittance may be reduced compared to the initial transmittance by the metal layer 430m. Thereafter, when a portion of the metal layer 430m is removed through ion milling, the light transmittance may increase again. That is, as the ion milling progresses, the light transmittance may increase. When ion milling is performed for about 300 seconds (t1), the light transmittance may be substantially saturated. According to some example embodiments, ion milling may be performed for about 300 seconds (t1) or more. According to some example embodiments, additional ion milling of about 100 seconds or more may be performed to completely remove the metal layer 430m located in the first opening 410OP corresponding to an emission region. Therefore, according to some example embodiments, ion milling may be performed for about 400 seconds (t2) or more or about 500 seconds (t3) or more.

According to one or more embodiments of the disclosure, a light extraction efficiency and light conversion efficiency of light passing through a color conversion layer may be improved by providing a reflective layer arranged around the color conversion layer of an optical panel, the reflective layer having irregularities on the surface thereof, and thus, a display device with improved display quality may be provided. In addition, in the process of forming the reflective layer around the color conversion layer, ion milling and ion bombardment may be used to simplify a manufacturing process of the display device, thereby providing a method of manufacturing a display device, which may improve manufacturing efficiency, reduce manufacturing quality defects, and reduce costs. However, the scope of embodiments according to the disclosure are not limited by the above effects.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims and their equivalents.

What is claimed is:
1. A display device comprising:
a first substrate;

first to third light-emitting elements on the first substrate, each of the first to third light-emitting elements including a first color emission layer;

an encapsulation layer covering the first to third light-emitting elements, the encapsulation layer including at least one inorganic layer and at least one organic layer;

a first light blocking layer on the encapsulation layer, the first light blocking layer including first openings respectively corresponding to the first to third light-emitting elements;

a reflective layer on the first light blocking layer, the reflective layer corresponding to an inner surface of each of the first openings;

a first color conversion layer in a first opening corresponding to the first light-emitting element;

a second color conversion layer in a first opening corresponding to the second light-emitting element;

a light transmission layer in a first opening corresponding to the third light-emitting element;

a second light blocking layer on the first light blocking layer, the second light blocking layer including second openings overlapping the first openings;

first to third color filter layers in the second openings, the first to third color filter layers respectively overlapping the first color conversion layer, the second color conversion layer, and the light transmission layer; and a first capping layer covering the first color conversion layer, the second color conversion layer, and the light transmission layer, wherein the first capping layer is sandwiched between the first and second light blocking layers, and one surface of the first light blocking layer is in contact with the first capping layer.

2. The display device of claim 1, further comprising a second capping layer covering the first to third color filter layers, wherein the first capping layer and the second capping layer sandwich the first to third color filter layers therebetween.

3. The display device of claim 1, further comprising a second substrate above one side of the first substrate such that the first to third light-emitting elements are located therebetween, wherein the second substrate covers the first to third color filter layers and the second light blocking layer.

4. The display device of claim 1, wherein the reflective layer includes a surface on which irregularities are formed.

5. The display device of claim 4, wherein the surface of the reflective layer has a grain boundary or a cluster.

6. The display device of claim 1, wherein the reflective layer includes a metal material that is silver, aluminum, gold, or a combination thereof.

7. The display device of claim 1, wherein the reflective layer has a thickness of 20 nanometers (nm) or more and 100 nm or less.

8. The display device of claim 1, wherein each of the first color conversion layer, the second color conversion layer, and the light transmission layer includes scattering particles, wherein the first color conversion layer further includes a first quantum dot, and the second color conversion layer further includes a second quantum dot, and the first quantum dot and the second quantum dot include a same material but have different sizes.

* * * * *